United States Patent
Medendorp, Jr. et al.

(10) Patent No.: US 9,099,575 B2
(45) Date of Patent: Aug. 4, 2015

(54) SOLID STATE LIGHTING DEVICES AND FABRICATION METHODS INCLUDING DEPOSITED LIGHT-AFFECTING ELEMENTS

(71) Applicant: Cree, Inc., Durham, NC (US)

(72) Inventors: Nicholas W. Medendorp, Jr., Raleigh, NC (US); Kurt S. Wilcox, Libertyville, IL (US); Brian Kinnune, Racine, WI (US)

(73) Assignee: CREE, INC., Durham, NC (US)

(*) Notice: Subject to any disclaimer, the term of this patent is extended or adjusted under 35 U.S.C. 154(b) by 0 days.

(21) Appl. No.: 13/943,043

(22) Filed: Jul. 16, 2013

(65) Prior Publication Data
US 2015/0021628 A1    Jan. 22, 2015

(51) Int. Cl.
| | |
|---|---|
| H01L 21/00 | (2006.01) |
| H01L 33/00 | (2010.01) |
| H01L 33/50 | (2010.01) |
| H01L 33/54 | (2010.01) |
| H01L 33/56 | (2010.01) |
| H01L 25/075 | (2006.01) |

(52) U.S. Cl.
CPC ............ *H01L 33/0095* (2013.01); *H01L 33/50* (2013.01); *H01L 33/54* (2013.01); *H01L 33/56* (2013.01); H01L 25/0753 (2013.01); H01L 2933/005 (2013.01); H01L 2933/0041 (2013.01)

(58) Field of Classification Search
CPC ............ H01L 33/005; H01L 2933/005; H01L 51/0011
USPC ................................ 438/38, 35; 427/66, 98.4
See application file for complete search history.

(56) References Cited

U.S. PATENT DOCUMENTS

| 6,273,596 B1 | 8/2001 | Parkyn |
|---|---|---|
| 6,350,041 B1 | 2/2002 | Tarsa et al. |

(Continued)

FOREIGN PATENT DOCUMENTS

| EP | 2412767 A1 | 2/2012 |
|---|---|---|
| JP | 2011148180 A | 8/2011 |

(Continued)

OTHER PUBLICATIONS

"Revolutionary 'Printoptical Technology' by LUXeXceL aXXelerates development of LED lighting," Press Release. LUXeXcel Group BV. 4 pages (2011).

(Continued)

*Primary Examiner* — Caridad Everhart
(74) *Attorney, Agent, or Firm* — Withrow & Terranova, P.L.L.C.; Vincent K. Gustafson

(57) ABSTRACT

Solid state light emitting devices include one or more light affecting elements (e.g., of one or more light-transmissive, light-absorptive, light-reflective, and/or lumiphoric materials) formed on, over, or around at least one solid state light emitter, with the light affecting elements including multiple fused elements embodying plurality of dots, rods, or layers such as may be formed by three-dimensional (3D) printing. At least one electrically conductive path in electrical communication with a solid state light emitter may be formed by selective material deposition such as 3D printing. Light affecting elements may be individually tailored to individual solid state light emitters, such as to yield different optical distributions for interactions between each specific emitter and its corresponding light affecting element.

26 Claims, 9 Drawing Sheets

(56) References Cited

U.S. PATENT DOCUMENTS

| | | | |
|---|---|---|---|
| 6,812,500 B2* | 11/2004 | Reeh et al. | 257/98 |
| 7,564,180 B2 | 7/2009 | Brandes | |
| 7,829,899 B2 | 11/2010 | Hutchins | |
| 7,858,998 B2 | 12/2010 | Negley | |
| 8,022,352 B2 | 9/2011 | Kaluzhny | |
| 8,269,240 B2 | 9/2012 | Negley | |
| 2004/0037076 A1 | 2/2004 | Katoh et al. | |
| 2005/0175257 A1* | 8/2005 | Kuroki | 382/278 |
| 2005/0207156 A1 | 9/2005 | Wang et al. | |
| 2006/0054039 A1 | 3/2006 | Kritchman et al. | |
| 2006/0134827 A1* | 6/2006 | Wood et al. | 438/106 |
| 2007/0223219 A1 | 9/2007 | Brandes et al. | |
| 2008/0179618 A1 | 7/2008 | Cheng | |
| 2008/0308825 A1 | 12/2008 | Chakraborty et al. | |
| 2010/0110659 A1 | 5/2010 | Nakajima | |
| 2010/0118086 A1* | 5/2010 | Silverbrook | 347/40 |
| 2010/0155763 A1 | 6/2010 | Donofrio et al. | |
| 2011/0025899 A1* | 2/2011 | Schmaelzle et al. | 348/308 |
| 2011/0220920 A1 | 9/2011 | Collins et al. | |
| 2011/0298877 A1 | 12/2011 | Blessing | |
| 2012/0019936 A1 | 1/2012 | Blessing et al. | |
| 2012/0224391 A1 | 9/2012 | Kim et al. | |
| 2012/0304449 A1 | 12/2012 | Jackson et al. | |

FOREIGN PATENT DOCUMENTS

| | | |
|---|---|---|
| KR | 20080043717 A | 5/2008 |
| WO | WO 2010/039141 A1 | 4/2010 |
| WO | WO 2012/064952 A1 | 5/2012 |
| WO | WO 2012/093086 A1 | 7/2012 |
| WO | WO 2013/063188 A1 | 5/2013 |

OTHER PUBLICATIONS

Langnau, L., "3D printing LED lighting optics," Make Parts Fast: A Design World Resource. (2012) http://www.makepartsfast.com/2012/07/3991/3d-printing-led-lighting-optics/ Accessed Jul. 2, 2013. 2 pages.

"White Paper: Street Lighting, LEDs: Coming Soon to a Street Light Near You, The Performance, Design and Cost Benefits of Power LEDs in Street Lighting," Philips. 7 pages.

* cited by examiner

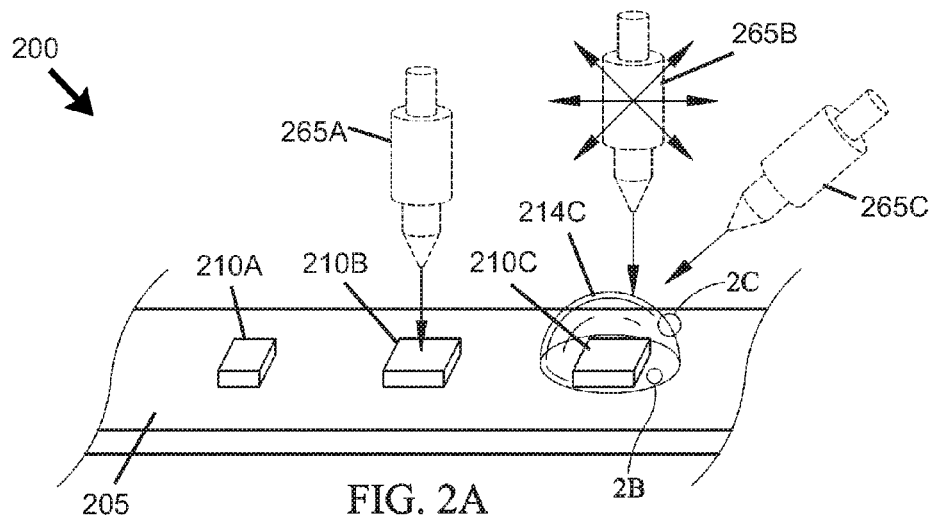
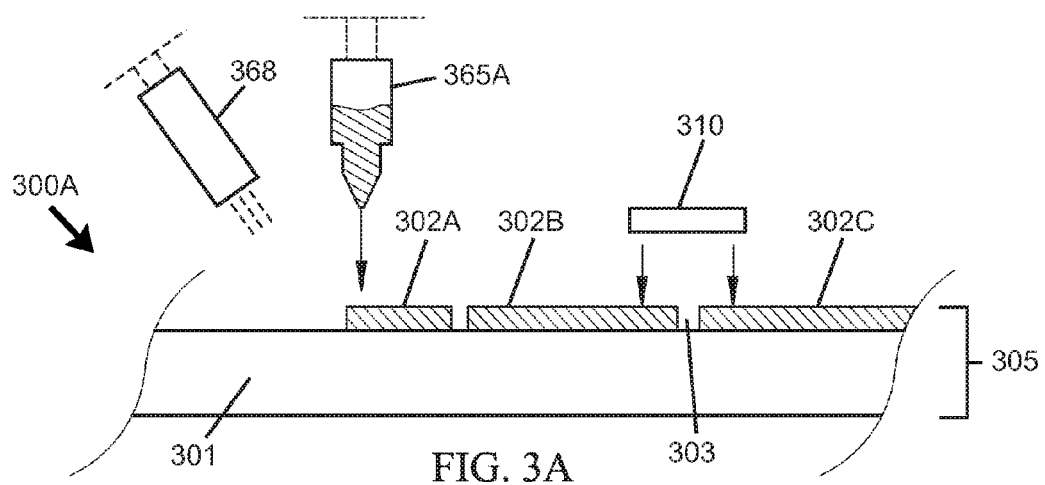

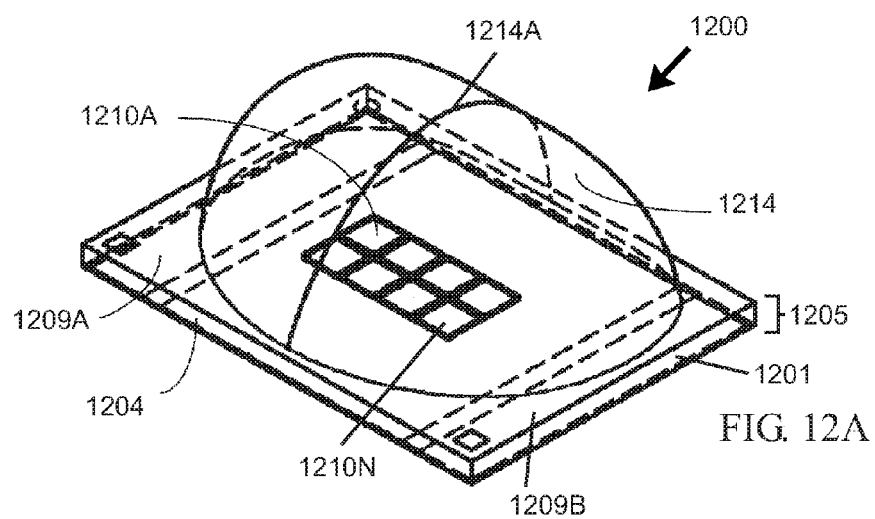
FIG. 12A
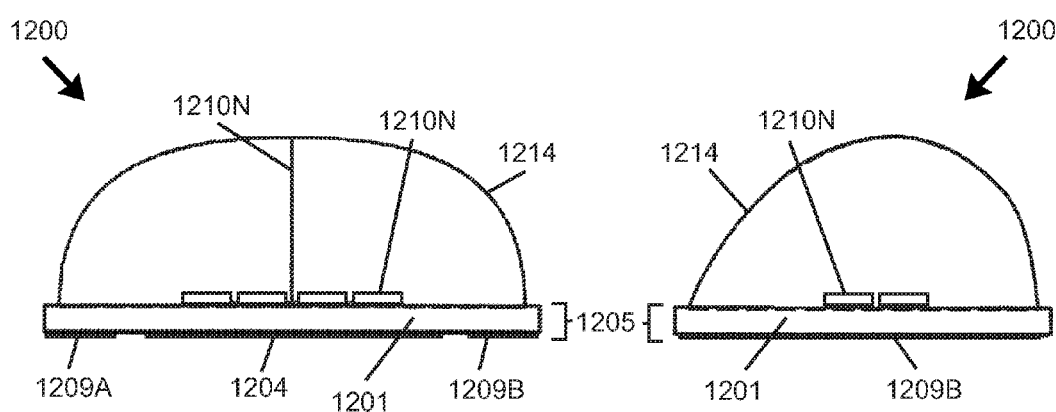
FIG. 12B
FIG. 12C
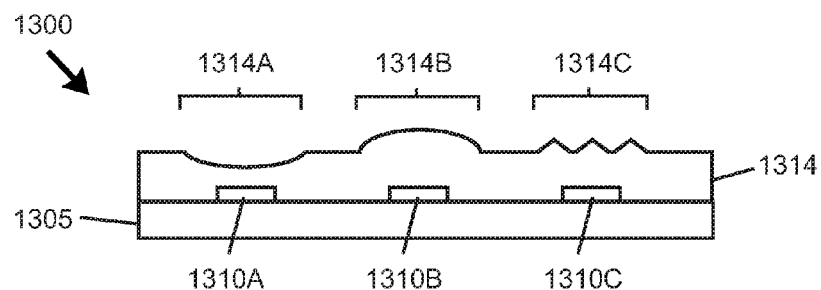
FIG. 13

SOLID STATE LIGHTING DEVICES AND FABRICATION METHODS INCLUDING DEPOSITED LIGHT-AFFECTING ELEMENTS

TECHNICAL FIELD

Subject matter herein relates to solid state lighting devices, including devices with light affecting elements (e.g., including light transmissive materials, light-reflective materials, light-absorptive materials, and/or lumiphoric materials), and relates to associated methods of making and using such devices.

BACKGROUND

Electrically activated emitters such as LEDs or lasers may be utilized to provide white light (e.g., perceived as being white or near-white), and have been investigated as potential replacements for incandescent, fluorescent, and metal halide high intensity discharge lamps. Solid state emitters may have associated filters that alter the color of the light and/or include lumiphoric materials (e.g., phosphors, scintillators, or lumiphoric inks/fluorescent dyes) that absorb a portion of emissions having a first peak wavelength emitted by the emitter and re-emit light having a second peak wavelength that differs from the first peak wavelength. Light perceived as white or near-white may be generated by a combination of red, green, and blue ("RGB") emitters, or, alternatively, by combined emissions of a blue light emitting diode ("LED") and a lumiphor such as a yellow phosphor. In the latter case, a portion of the blue LED emissions pass through the phosphor, while another portion of the blue LED emissions is converted to yellow, and the blue and yellow light in combination provide light that is perceived as white. Another approach for producing white light is to stimulate lumiphors of multiple colors with a violet or ultraviolet LED source.

LEDs are commercially available as bare LED chips, or as single-chip or multi-chip LED packages. A LED package may include a substrate or submount and at least one LED chip arranged over the substrate or submount. A LED package may further include one or more of the following features: electrical contacts, protective material such as an encapsulant, a reflector, and a lens or diffuser. Fabrication of a conventional LED package typically entails multiple steps such as formation of a leadframe, molding a package body around the leadframe, adding a reflective material to the package body, mounting LED chips to the leadframe, establishing electrical connections between the leadframe and the LED chips (e.g., by forming wirebonds), providing encapsulant material, lumiphoric material, and/or light dispersing material over the LEDs, and adding or forming a lens. LED chips or LED packages may be used in fabricating lighting devices that often include further reflectors, lenses, and the like.

LED chips and/or LED packages are typically performance tested and "binned" (i.e., sorted) according to ranges of dominant wavelength and brightness. Such binning permits intensity and/or color matching between various LED chips or LED packages for use in a particular product or product line. Performance characteristics of LED chips or LED packages may affect their economic value and/or utilization in saleable products. It would be desirable to reduce differences in performance between different LED chips or LED packages after binning is complete, but it has been impractical to do so.

Potential benefits associated with solid state emitters relative to other light emitting device technologies include increased efficiency, longer service life (with concomitant reduction in maintenance costs), reduced waste heat emissions, reduced size/form factor, and mercury-free construction. Numerous end use applications exist for solid state lighting devices, including (but not limited to) interior and exterior lighting for residential/commercial/industrial/entertainment structures and facilities, interior and exterior lighting for vehicles (including but not limited to automobiles), and street lighting (including lighting for roadways and parking areas). Street lighting represents a particularly desirable end use for solid state lighting technology, since it is difficult and expensive to periodically replace light-emitting components of street lights, and long life of solid state lighting devices dramatically reduces the frequency with which light-emitting components need to be changed relative to emitters embodying other lighting technologies.

In typical street light applications, it is desirable to provide sufficiently even light distribution to meet recommended street light uniformity levels while minimizing spillover of light in undesired directions (i.e., wasted light) and minimizing hot spots that may lead to undesirable visibility, safety, and/or glare problems. A traditional filament-based lamp emits light from a single source (i.e., a bulb), and utilizes shields, reflectors, and/or lenses to point an emitted beam in one or more desired directions. In contrast, when solid state (e.g., LED) lamps are used for street lighting applications, an array of packaged LEDs may be placed (e.g., at different angles) in a luminaire, with light affecting elements such as reflectors, shields, and/or secondary optics typically arranged to direct light emitted by the packaged LEDs to desired locations. The use of multiple light affecting elements for individual LEDs (or groups of LEDs) provides enhanced flexibility in controlling properties (e.g., shape, direction, overlap, etc.) of multiple output beams; however, it can be cumbersome and labor-intensive to provide a large number of light affecting elements in a single luminaire and to match individual light affecting elements to individual solid state emitters. Moreover, the use of primary optics associated with LED packages in conjunction with secondary optics associated such luminaires tends to result in optical losses that slightly reduce light output.

The art continues to seek improved lighting devices and lighting device fabrication methods that address one or more limitations inherent to conventional devices and methods.

SUMMARY

The present invention relates in various aspects to solid state (e.g., LED) lighting devices including one or more light affecting elements formed on, over, or around at least one solid state light emitter, wherein the light affecting element(s) include multiple fused elements comprising a plurality of dots, rods, or layers such as may be formed by three-dimensional (3D) printing. In certain aspects, at least one electrically conductive path may be formed from a substrate to a distal (e.g., top) side of one or more solid state light emitter chips using at least one fused electrically conductive element comprising a plurality of dots, rods, or layers. Microscopic boundaries may be present between adjacent dots, rods, or layers (e.g., of light affecting elements and/or electrically conductive paths). Methods for fabricating lighting devices may include depositing at least one light affecting element on, over, or around the at least one solid state light emitter by 3D printing. 3D printing may be utilized to deposit light affecting elements including light-transmissive materials, light-absorptive materials, light-reflective materials, and/or lumiphoric materials. Lumiphoric material may optionally be dispersed within or integrated with another material. Different light affecting elements arranged to interact with different solid state light emitters may differ with respect to one or more parameters (e.g., composition, concentration, thickness, shape, etc.). Multiple light affecting elements may be arranged to separately interact with multiple solid state light emitters arranged on or over a common substrate to yield different optical distributions for different combinations of solid state light emitters light affecting elements associated therewith. One or more light affecting elements may be arranged to affect beam width, beam direction, beam focus, and/or beam symmetry of light emissions output by a lighting device. One or more light affecting elements may include multiple compositionally different materials deposited in discrete areas. At least one light-affecting element may include a cup or dam.

In one aspect, the invention relates to a method for fabricating a lighting device including at least one solid state light emitter arranged on or over a substrate, the method comprising depositing at least one light affecting element on, over, or around the at least one solid state light emitter using a three-dimensional printing process. At least one light affecting element may be arranged to receive at least a portion of emissions generated by the at least one solid state light emitter. At least one light affecting element may be deposited on at least one solid state light emitter and/or on a substrate. At least one light-affecting element may include fused dots, rods, or layers, which may optionally include at least one outer dimension (e.g., height, width, or length) of less than about 100 µm, and microscopic boundaries may be provided between adjacent dots, rods, or layers. Conductive regions of a substrate may be formed by 3D printing. At least one conductive path between a solid state emitter and a substrate may be formed by 3D printing. Fabrication of light affecting elements may be adjusted (e.g., with respect to material composition, concentration, thickness, and/or shape) based on information indicative of output characteristics of solid state light emitters, with capability to make such adjustments on an emitter-specific basis. Different light affecting elements may be formed to provide different light distributions from different solid state light emitters based on interaction between solid state light emitters and respective light affecting elements. Multiple material dispensing heads and/or nozzles may be used to simultaneously deposit different light affecting elements on, over, or around different solid state light emitters mounted to a single substrate. In one embodiment, deposition of at least one light affecting element includes simultaneously (i) utilizing a first deposition head to deposit a first light affecting element on, over, or around a first solid state light emitter and (ii) utilizing a second deposition head to deposit a second light affecting element on, over, or around a second solid state light emitter, wherein both the first and second light affecting element are arranged on or over a single substrate.

In another aspect, the invention relates to a lighting device comprising: a substrate; at least one solid state light emitter arranged on or over the substrate; and at least one light affecting element arranged to receive at least a portion of emissions generated by the at least one solid state light emitter; wherein the at least one light affecting element including a plurality of fused elements comprising a plurality of dots, rods, or layers, and the at least one light affecting element comprises at least one of: (i) a light-transmissive material deposited on at least one of the substrate and the at least one solid state light emitter and arranged to transmit at least a portion of a spectral output of the at least one solid state light emitter, (ii) a light-absorptive material deposited on at least one of the substrate and the at least one solid state light emitter and arranged to absorb at least a portion of a spectral output of the at least one solid state emitter, (iii) a light-reflective material deposited on or over the substrate and arranged to reflect at least a portion of a spectral output of the at least one solid state light emitter; and (iv) a lumiphoric material arranged to absorb at least a portion of a spectral output of the at least one solid state emitter and responsive re-emit at least one spectral output comprising a different peak wavelength than a peak wavelength of the at least one solid state light emitter. In certain embodiments, dots, rods, or layers may include outer dimensions (e.g., height, width, or length) of less than about 100 µm. In certain embodiments, dots, rods, or layers may be formed by three-dimensional printing. In certain embodiments, a substrate may include electrically conductive regions formed by 3D printing. In certain embodiments, a substrate may include a metal core circuit board, a flexible substrate (e.g., a flexible circuit board), and/or a substantially transparent material. In certain embodiments, the at least one solid state light emitter comprises a plurality of LEDs. In certain embodiments, a single light affecting element may be arranged on, over, or around multiple LEDs. In certain embodiments, a light affecting element arranged to receive light from a specific solid state light emitter may be spatially segregated from (e.g., in a non-contacting relation with) the specific solid state light emitter. In certain embodiments, at least one light affecting element may provide heatsinking utility, may comprise comprises a thermal conductivity of at least 50 W/m-C, may be arranged in conductive thermal communication with the at least one solid state light emitter, and may arranged to dissipate heat generated by the at least one solid state light emitter to an ambient air environment.

In another aspect, the invention relates to a lighting device comprising: a substrate including at least one electrically conductive region; at least one solid state light emitter arranged on or over the substrate, wherein a proximal surface of the at least one solid state emitter is arranged adjacent to the substrate, and a distal surface of the at least one solid state emitter is arranged distal from the substrate; and at least one electrically conductive path between the at least one electrically conductive region and at least one electrical contact arranged along the distal surface, wherein the at least one electrically conductive path includes at least one fused electrically conductive element comprising a plurality of dots, rods, or layers. Microscopic boundaries between adjacent dots, rods, or layers may be provided, and each dot, rod, or layer may include an outer dimension of less than about 100 micrometers. Such dots, rods, or layers may be formed by 3D printing. An electrically insulating material arranged between at least one sidewall of the at least one electrically conductive solid state light emitter and the at least one fused electrically conductive element.

In another aspect, the invention relates to a method comprising illuminating an object, a space, or an environment, utilizing a LED device as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the invention will be more fully apparent from the ensuing disclosure and appended claims.

BRIEF DESCRIPTION OF THE DRAWINGS

FIG. 2A is a perspective schematic view of multiple solid state light emitter chips arranged on a substrate and proximate to material dispensing heads of a three-dimensional printing system, with one solid state light emitter chip including at least one light affecting element formed thereon.

FIG. 2B is a magnified cross-sectional schematic view of a first portion of a light affecting element illustrated FIG. 2A, including printed material arranged as fused rods deposited on or over a portion of a solid state light emitter.

FIG. 2C is a magnified cross-sectional view of a second portion of a light affecting element illustrated FIG. 2A, including printed material arranged as fused layers deposited on or over a portion of a solid state light emitter.

FIG. 3A is a cross-sectional schematic view of a dispensing head of a three-dimensional printing system proximate to a portion of a first subassembly of a solid state lighting device (i.e., in a first state of manufacture) including formation of electrically conductive traces over which one or more solid state light emitter chips may be arranged.

FIG. 12A is a perspective transparency view of a solid state lighting device including multiple solid state light emitter chips disposed in a two-dimensional array and arranged under or within a light affecting element including an asymmetric curved lens subject to being fabricated by three-dimensional printing.

FIG. 12B is a front elevation view of the solid state lighting device of FIG. 12A.

FIG. 12C is a side elevation view of the solid state lighting device of FIGS. 12A-12B.

FIG. 13 is a front elevation view of at least a portion of a solid state lighting device including multiple solid state light emitter chips arranged under or within a substantially continuous light affecting element including different light-affecting sub-elements subject to being fabricated by three-dimensional printing, wherein the light-affecting sub-elements are arranged to interact with separate solid state light emitter chips to yield different optical distributions for interactions between each specific emitter and its corresponding light affecting sub-element.

DETAILED DESCRIPTION

Figure 1:
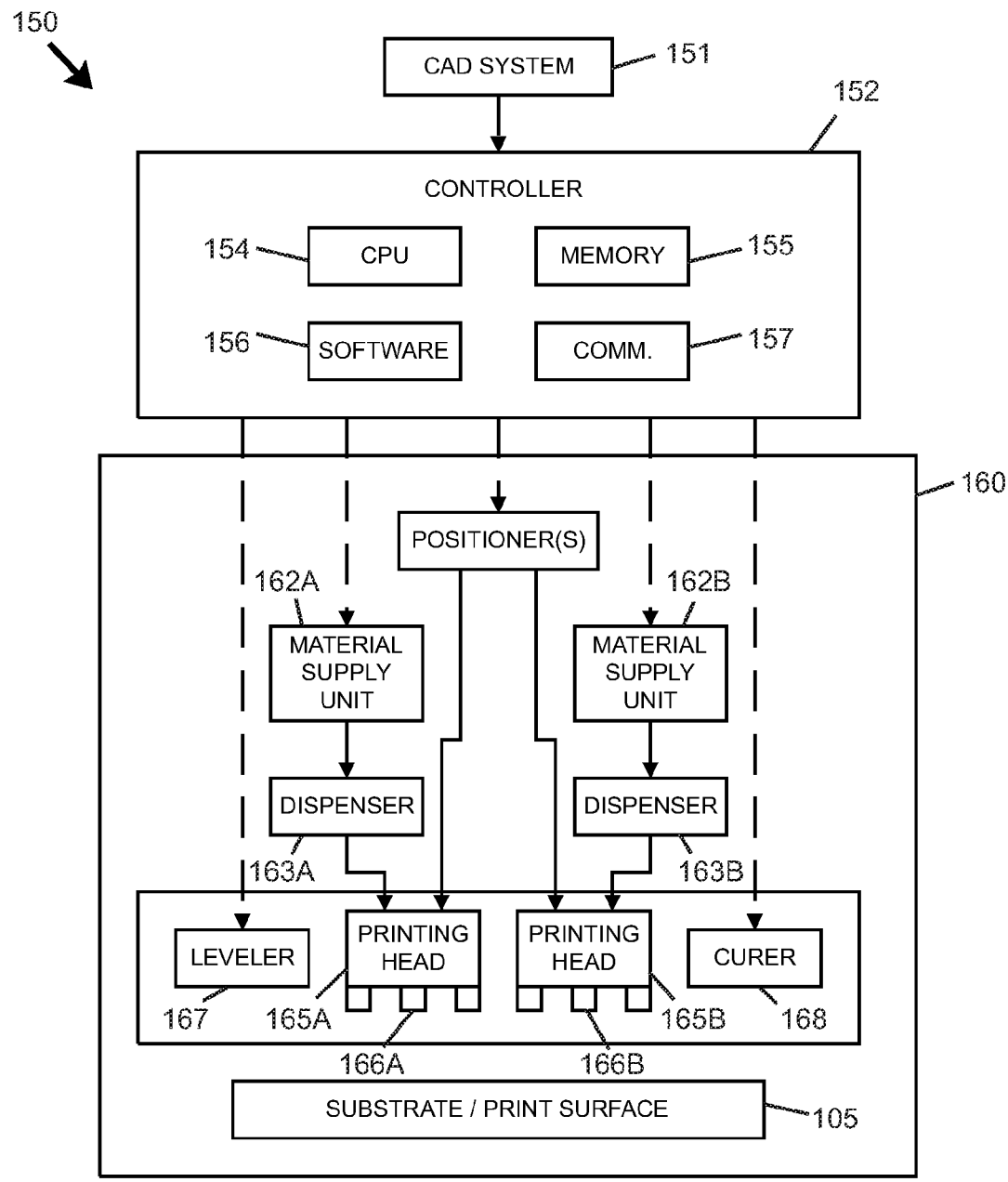
FIG. 1 is an interconnection diagram illustrating various components of a three-dimensional printing system for fabricating solid state lighting devices according to the present invention.

The present invention relates in various aspects to solid state (e.g., LED) lighting devices including one or more light affecting elements formed on, over, or around at least one solid state light emitter, wherein the light affecting element(s) include multiple fused elements comprising a plurality of dots, rods, or layers such as may be formed by three-dimensional (3D) printing. In certain aspects, electrically conductive paths may be formed from a substrate to a distal (e.g., top) side of one or more solid state light emitter chips using at least one fused electrically conductive element comprising a plurality of dots, rods, or layers. 3D printing may be used to form fused elements, with at least some dots, rods, or layers having at least one dimension (e.g., height, width, or length) of less than about 100 micrometers. Microscopic boundaries may be present between adjacent dots, rods, or layers (e.g., of light affecting elements and/or electrically conductive paths).

Use of selective deposition techniques such as 3D printing to form light affecting elements and/or electrically conductive paths may address various limitations inherent to conventional devices. For example, such techniques may permit light-affecting elements to be tailored to specific solid state light emitters, and may permit output properties of multiple output beams to be controlled. Such techniques also enable reduction in the number and type of processing steps for fabricating solid state light-emitting devices. Selective deposition techniques such as 3D printing may reduce differences in performance between different LED chips or LED packages after binning is complete. Such techniques may also reduce the need for providing both primary and secondary optical elements in a lighting device.

In certain embodiments, solid state light emitters as disclosed herein include bare (unpackaged) LED chips. In certain embodiments, at least one light affecting element may be formed directly on one or more bare LED chips. In certain embodiments, continuous deposited material (e.g., 3D deposited material(s)) may be arranged between at least one primary light emitting surface of a solid state emitter chip (e.g., a bare LED) and an environmental contact surface, thereby eliminating the need for combining primary and secondary optical elements formed on different production lines and/or by different manufacturing techniques, and reducing optical losses associated with multiple discrete optical elements arranged in series.

Unless otherwise defined, terms used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

Embodiments of the invention are described herein with reference to cross-sectional, perspective, elevation, and/or plan view illustrations that are schematic illustrations of idealized embodiments of the invention. Variations from the shapes of the illustrations as a result, for example, of manufacturing techniques and/or tolerances, are to be expected, such that embodiments of the invention should not be construed as limited to particular shapes illustrated herein. This invention may be embodied in different forms and should not be construed as limited to the specific embodiments set forth herein. In the drawings, the size and relative sizes of layers and regions may be exaggerated for clarity.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions.

The term "fused" as used herein refers to the state of being solidified from particles and/or liquids. In certain embodiments, dots, rods, or layers of powder-containing or liquid-containing material may be fused by curing (such as with application of thermal energy, radiation, and/or chemicals) and/or by cooling. In certain embodiments, ultraviolet light may be used to promote curing of photosensitive liquid and/or photosensitive particulate material. In certain embodiments, curing may be promoted or assisted by heating. In certain embodiments, fused materials embody microscopic boundaries between adjacent dots, rods, or layers. Dots may have any desired cross-sectional and three-dimensional shapes, including (but not limited to) spheroidal and partially flattened spheroidal shapes. Rods may be straight or curved with any desired cross-sectional shape, and may be formed by continuous deposition of material accompanied by relative movement by a dispensing head and/or workpiece (e.g., substrate), analogous to dispensation of toothpaste from a conventional toothpaste tube. In certain embodiments, individual dots, rods, or layers of a fused element as described herein may include at least one outer dimension of less than about 100 μm.

The terms "three dimensional printing" and "3D printing" as used herein refer to processes for selective addition (e.g., deposition) of one or more materials typically in particulate and/or fluid (e.g., liquid) form, followed by at least partial fusion (e.g., consolidation) of the deposited material(s). Materials may be sequentially deposited as multiple layers, dots, or rods that may be stacked upon one another to form any desired three-dimensional shapes. In certain embodiments, deposited material(s) include at least one photopolymer material that is at least partially curable by application of electromagnetic radiation (e.g., laser energy) or other materials suitable for 3D object construction. In certain embodiments, deposited material may include viscous liquid or slurry, or soft gel-like or paste-like compositions. In certain embodiments, metal or metal-containing powder may be deposited on a surface, excess material may be removed if necessary, and the resulting material may be sintered with heat and/or radiation (or otherwise cured) form a metal layer or metal-containing layer that may comprise a metal grain structure. Multiple steps of material (e.g., powder) deposition, excess material removal, and curing (e.g., sintering) may be utilized in sequence, to form a structure that is or appears to be substantially continuous (but which may include microscopic boundaries and/or changes in grain structure between adjacent layers, rods, or dots). In certain embodiments, a fused material layer may comprise a porous metal, porous metal-containing, porous polymeric, or porous polymer-containing structure. In certain embodiments, a fused material layer may be non-porous in character. Various types of curable material may be dispensed separately or in combination. In certain embodiments, 3D printing may include sequential steps of deposition of powder and binder (e.g., epoxy or resin). Relative movement may be effected between one or more deposition heads and a workpiece during a 3D printing process. A process of forming a plurality of rods, dots, or layers (e.g., to form dots, rods, or layers sequentially deposited on other dots, rods, or layers) may be repeated as many times as necessary to form a structure of any desired dimensions.

The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the invention may include III-V nitride (e.g., gallium nitride) based LED chips or laser chips fabricated on a silicon, silicon carbide, sapphire, or III-V nitride growth substrate, including (for example) devices manufactured and sold by Cree, Inc. of Durham, N.C. Such LEDs and/or lasers may be configured to operate such that light emission occurs through the substrate in a so-called "flip chip" orientation. Such LED and/or laser chips may also be devoid of growth substrates (e.g., following growth substrate removal).

LED chips useable with lighting devices as disclosed herein may include horizontal devices (with both electrical contacts on a same side of the LED) and/or vertical devices (with electrical contacts on opposite sides of the LED). A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or printed circuit board (PCB), and have a second terminal wire bonded to the carrier substrate, electrical element, or PCB. Examples of vertical and horizontal LED chip structures are disclosed, for example, in U.S. Patent Application Publication No. 2008/0258130 to Bergmann et al. and in U.S. Patent Application Publication No. 2006/0186418 to Edmond et al., the disclosures of which are hereby incorporated by reference herein in their entireties. Although various embodiments shown in the figures may be appropriate for use with vertical LEDs, it is to be appreciated that the invention is not so limited, such that any combination of one or more of the following LED configurations may be used in a single solid state light emitting device: horizontal LED chips, horizontal flip LED chips, vertical LED chips, vertical flip LED chips, and/or combinations thereof, with conventional or reverse polarity Solid state light emitters may be used individually or in groups to emit one or more beams to stimulate emissions of one or more lumiphoric materials (e.g., phosphors, scintillators, lumiphoric inks, quantum dots, day glow tapes, etc.) to generate light at one or more peak wavelength, or of at least one desired perceived color (including combinations of colors that may be perceived as white). In certain embodiments, one or more lumiphoric (also called "luminescent") materials may be deposited directly on (e.g., coated on) solid state light emitter chips. In other embodiments, lumiphoric materials may be coated on lumiphor support elements or lumiphor support surfaces (e.g., by powder coating, inkjet printing, or the like), adding such materials to lenses, and/or by embedding or dispersing such materials within other elements (e.g., lenses, lumiphor support elements, etc.) or surfaces. Examples of lumiphoric materials are disclosed, for example, in U.S. Pat. No. 6,600,175 and U.S. Patent Application Publication No. 2009/0184616. Other materials, such as light scattering elements (e.g., particles), light diffusing materials, and/or index matching materials, may be associated with a lumiphoric material-containing element or surface. In certain embodiments, individual dots, rods, or layers subject to being formed by 3D printing may comprise quantum dots.

In certain embodiments, at least one lumiphoric material may be spatially segregated from (e.g., separated by an intervening material or an air gap) and arranged to receive emissions from at least one solid state light emitter. In certain embodiments, one or more diffusing elements may be arranged to receive and diffuse emissions generated by at least one lumiphor.

In certain embodiments, a spatially segregated lumiphor may be arranged to fully cover one or more solid state light emitters of a lighting device. In certain embodiments, a spatially segregated lumiphor may be arranged to cover only a portion or subset of one or more solid state light emitters.

In certain embodiment, a lumiphor may be arranged with a substantially constant thickness and/or concentration relative to different solid state light emitters. In certain embodiments, a lumiphor may be arranged with substantially different thickness and/or concentration relative to different solid state light emitters. In one embodiment, a lumiphor is arranged to cover all electrically activated emitters of a lighting device, but with substantially different thickness and/or concentration of lumiphor material proximate to different solid state light emitters.

A lumiphor that is spatially segregated from one or more electrically activated emitters may have associated light scattering particles or elements, which may be arranged with substantially constant thickness and/or concentration relative to solid state light emitters of different colors, or may be intentionally arranged with substantially different thickness and/or concentration relative to different solid state light emitters. Multiple lumiphors (e.g., lumiphors of different compositions) may be applied with different concentrations or thicknesses relative to different solid state light emitters. In one embodiment, lumiphor composition, thickness and/or concentration may vary relative to multiple solid state light emitters, while scattering material thickness and/or concentration may differently vary relative to the same multiple solid state light emitters. In one embodiment, one or more lumiphoric material may be deposited directly on or over an optical element such as a dichroic filter.

The term "substrate" as used herein in connection with lighting apparatuses refers to a mounting element on which, in which, or over which multiple solid state light emitters (e.g., emitter chips) may be arranged or supported (e.g., mounted). Exemplary substrates useful with lighting apparatuses as described herein include printed circuit boards (including but not limited to metal core printed circuit boards, flexible circuit boards, dielectric laminates, and the like) having electrical traces arranged on one or multiple surfaces thereof, support panels, and mounting elements of various materials and conformations arranged to receive, support, and/or conduct electrical power to solid state emitters. In certain embodiments, a substrate, mounting plate, or other support element on or over which multiple LED components may be mounted, may comprise one or more portions of, or all of, a printed circuit board (PCB), a metal core printed circuit board (MCPCB), a flexible printed circuit board, a dielectric laminate (e.g., FR-4 boards as known in the art) or any suitable substrate for mounting LED chips and/or LED packages. In certain embodiments, a substrate may comprise one or more materials arranged to provide desired electrical isolation and high thermal conductivity. In certain embodiments, at least a portion of a substrate may include a dielectric material to provide desired electrical isolation between electrical traces or components of multiple LED sets. In certain embodiments, a substrate can comprise ceramic such as alumina, aluminum nitride, silicon carbide, or a polymeric material such as polyimide, polyester, etc. In certain embodiments, substrate can comprise a flexible circuit board or a circuit board with plastically deformable portions to allow the substrate to take a non-planar (e.g., bent) or curved shape allowing for directional light emission with LED chips of one or more LED components also being arranged in a non-planar manner. In certain embodiments, a substrate may be substantially transmissive of visible light or even transparent.

In certain embodiments, one or more electrically conductive regions may be deposited by 3D printing on a carrier to form a substrate. Such electrically conductive regions may preferably comprise metal, although electrically conductive polymers may also be used.

The term "light-transmissive material" as used herein refers to any acceptable material in the art that transmits of a majority of a desired wavelength range such as one or more of visible light, ultraviolet light, and/or infrared light, or subsets thereof. A preferred light-reflective material would be at least about 50%, 55%, 60%, 65%, 70%, 75%, 80%, 85%, 90%, 95%, 98%, 99% or more transmissive of light of a desired wavelength range.

The term "light-absorptive material" as used herein refers to any acceptable material in the art that absorbs a majority of a desired wavelength range such as one or more of visible light, ultraviolet light, and/or infrared light, or subsets thereof. A preferred light-absorptive material would be at least about 50%, 55%, 60%, 65%, 70%, 75%, 80%, 85%, 90%, 95%, 98%, 99%, or more absorptive of light of a desired wavelength range.

The term "light-reflective material" as used herein refers to any acceptable reflective material in the art, including (but not limited to) MCPET (foamed white polyethylene terephthalate), and surfaces metalized with one or more metals such as (but not limited to) silver (e.g., a silvered surface). MCPET manufactured by Otsuka Chemical Co. Ltd. (Osaka, Japan) is a diffuse white reflector that has a total reflectivity of 99% or more, a diffuse reflectivity of 96% or more, and a shape holding temperature of at least about 160° C. A preferred light-reflective material would be at least about 90% reflective, more preferably at least about 95% reflective, and still more preferably at least about 98-99% reflective of light of a desired wavelength range, such as one or more of visible light, ultraviolet light, and/or infrared light, or subsets thereof. In certain embodiments, a reflective material is specularly reflective. In certain embodiments, a reflective material is diffusively reflective. A reflector as disclosed herein may include at least one light-reflective material. In certain embodiments, a reflector as disclosed herein includes multiple non-coplanar reflective surfaces, such as may be arranged in a curved reflector cup or a faceted reflector.

In certain embodiments, lighting devices or light emitting apparatuses as described herein may include at least one LED with a peak wavelength in the visible range. Multiple LEDs may be provided, and such LEDs may be controlled together or independently. In certain embodiments, at least two independently controlled short or medium wavelength (e.g., blue, cyan, or green) LEDs may be provided in a single LED component and arranged to stimulate emissions of lumiphors (e.g., yellow green, orange, and/or red), which may comprise the same or different materials in the same or different amounts or concentrations relative to the LEDs. In certain embodiments, multiple electrically activated (e.g., solid state) emitters may be provided, with groups of emitters being separately controllable relative to one another. In certain embodiments, one or more groups of solid state emitters as described herein may include at least a first LED chip comprising a first LED peak wavelength, and include at least a second LED chip comprising a second LED peak wavelength that differs from the first LED peak wavelength by at least 20 nm, or by at least 30 nm (preferably, but not necessarily, in the visible range). In certain embodiments, solid state emitters with peak wavelengths in the ultraviolet (UV) range may be used to stimulate emissions of one or more lumiphors. In certain embodiments, emitters having similar output wavelengths may be selected from targeted wavelength bins. In other embodiments, emitters having different output wavelengths may be selected from different wavelength bins, with peak wavelengths differing from one another by a desired threshold (e.g., at least 20 nm, at least 30 nm, at least 50 nm, or another desired threshold). In certain embodiments, at least one LED having a peak wavelength in the blue range is arranged to stimulate emissions of at least one lumiphor having a peak wavelength in the yellow range.

The expression "peak wavelength", as used herein, means (1) in the case of a solid state light emitter, to the peak wavelength of light that the solid state light emitter emits if it is illuminated, and (2) in the case of a lumiphoric material, the peak wavelength of light that the lumiphoric material emits if it is excited.

In certain embodiments, light emitting apparatuses as disclosed herein may be used as described in U.S. Pat. No. 7,213,940, which is hereby incorporated by reference as if set forth fully herein. In certain embodiments, a combination of light (aggregated emissions) exiting a lighting emitting apparatus including multiple LED components as disclosed herein, may, in an absence of any additional light, produce a mixture of light having x, y color coordinates within an area on a 1931 CIE Chromaticity Diagram defined by points having coordinates (0.32, 0.40), (0.36, 0.48), (0.43, 0.45), (0.42, 0.42), (0.36, 0.38). In certain embodiments, combined emissions from a lighting emitting apparatus as disclosed herein may embody at least one of (a) a color rendering index (CRI Ra) value of at least 85, and (b) a color quality scale (CQS) value of at least 85.

Some embodiments of the present invention may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; with the disclosures of the foregoing patents and published patent applications being hereby incorporated by reference as if set forth fully herein.

The expressions "lighting device" and "light emitting apparatus", as used herein, are not limited, except that they are capable of emitting light. That is, a lighting device or light emitting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or backlighting, light bulbs, bulb replacements, outdoor lighting, street lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting-work lights, etc., mirrors/vanity lighting, or any other light emitting devices. In certain embodiments, lighting devices or light emitting apparatuses as disclosed herein may be self-ballasted.

The inventive subject matter further relates in certain embodiments to an illuminated enclosure (the volume of which can be illuminated uniformly or non-uniformly), comprising an enclosed space and at least one lighting device or light emitting apparatus as disclosed herein, wherein at least one lighting device or light emitting apparatus illuminates at least a portion of the enclosure (uniformly or non-uniformly).

In certain embodiments, at least one lumiphoric material may be spatially segregated from, and arranged to receive emissions from, one or more electrically activated solid state emitters of a lighting device. Such spatial separation may extend over an intervening material or an intervening gap. In certain embodiments, at least one light affecting element (e.g., an optical filters or an optical reflectors, including a dichroic filter) may arranged between the one or more electrically activated solid state emitters and at least one lumiphoric material.

In certain embodiments, a method for fabricating a lighting device includes depositing at least one light affecting element on, over, or around the at least one solid state light emitter using a three-dimensional printing process, following mounting of the at least one solid state emitter on a substrate. At least one light-affecting element may include fused dots, rods, or layers, which may optionally include at least one outer dimension of less than about 100 µm, and multiple microscopic boundaries may be provided between adjacent dots, rods, or layers of the plurality of dots, rods, or layers. Light-affecting elements are preferably arranged to receive at least a portion of emissions generated by the at least one solid state light emitter, and may include light transmissive elements, light reflective elements, and/or light absorptive elements. In certain embodiments, one or more light affecting elements may be deposited on (e.g., directly on) at least one solid state light emitter. In certain embodiments, one or more light affecting elements may be deposited on (e.g., directly on) portions of a substrate. In certain embodiments, light affecting elements may include any one or more of the following: a lens; a diffuser; a reflector; a light-absorptive material arranged to prevent transmission of light through the at least one light affecting element; a lumiphoric material; and a cup or dam.

In certain embodiments, a cup or dam may formed around a light emitting element, and such cup or dam may be partially or completely filled by dispensing a material (e.g., a liquid material) into a recess bounded by the cup or dam.

In certain embodiments, a light affecting element may include a partially light absorptive material comprising a lumiphoric material that is arranged to absorb at least a portion of a spectral output of the at least one solid state emitter and responsive re-emit at least one spectral output comprising a different peak wavelength than a peak wavelength of the at least one solid state light emitter.

In certain embodiments including selectively deposited light affecting elements comprising lumiphoric materials, different material compositions, concentrations, thicknesses, and/or patterns of lumiphoric material may be arranged relative to different solid state emitters. In certain embodiments, one or more parameters of lumiphoric material deposition may be adjusted to reduce differences in performance between different solid state emitter chips (e.g., LED chips) or groups of chips after binning is complete. Individual tailoring or adjustment of lumiphoric material deposition responsive to solid state emitter characteristics is feasible using 3D printing, whereas such tailoring would be highly impractical according to prior methods. In certain embodiments, spectral output differences among different solid state emitter chips may be reduced by at least one, at least two, at least three, or at least four MacAdam ellipses by adjusting selective deposition of lumiphoric material on such chips using 3D printing. In certain embodiments, at least some substantially identical light affecting elements may be arranged on, over, or around at least some substantially identical solid state emitters mounted to a single substrate.

In certain embodiments, a substrate includes a carrier or base material, and multiple electrically conductive regions may be deposited on the carrier or base material by three-dimensional printing, and such deposition may immediately precede formation of one or more light affecting elements on or over the substrate and/or solid state light emitters. In other embodiments, a substrate may be patterned with electrical traces by any conventional method.

In certain embodiments, electrically conductive paths between conductive regions of a substrate and a distal major surface (e.g., top side) of a LED mounted on the substrate may include fused conductive dots, rods, or layers (such as may be formed by 3D printing), thereby augmenting or eliminating the need for wirebonds.

In certain embodiments, at least one light affecting element may include multiple compositionally different materials deposited in discrete areas of the at least one light affecting element. Multiple compositionally different materials may be deposited with sharp transitions from one material to another, or with graduated (i.e., gradient) transitions wherein concentration of respective materials vary continuously with direction along a material transition zone.

In certain embodiments, one or more light affecting elements may be arranged to affect beam width, beam direction, beam focus, and/or beam symmetry of light emissions output by a lighting device.

In certain embodiments, light affecting elements may be individually tailored or adjusted during formation by a selective deposition (e.g., 3D printing) process in order to yield different optical distributions for respective combinations of solid state light emitters and corresponding light affecting elements. For example, a first light affecting element may be deposited on, over, or around the first solid state light emitter arranged to yield a first optical distribution based on interaction between the first solid state light emitter and the first light affecting element, and a second light affecting element may be deposited on, over, or around the second solid state light emitter arranged to yield a second optical distribution based on interaction between the second solid state light emitter and the second light affecting element, wherein the first optical distribution differs from the second optical distribution. In certain embodiments, the first optical distribution differs from the second optical distribution with respect to at least one (or possibly more than one) of the following parameters: beam width, beam direction, beam focus, and beam symmetry.

In certain embodiments, tailoring or adjustment of characteristics of one or more light affecting elements may be performed by adjusting at least one of material composition, material concentration, thickness, and shape respective light affecting elements. Such tailoring or adjustment may be responsive to obtaining or receiving information indicative of output characteristics of different solid state light emitters, following testing of such emitters (e.g., using a photometer or other suitable instrument(s)) in order to determine one or more characteristics of such emitters. Following such adjustment or tailoring, at least one of material composition, material concentration, material curing, thickness, and shape may differ among multiple light affecting elements.

In certain embodiments, multiple solid state light emitter chips arranged under or within a substantially continuous light-affecting element subject to being fabricated by 3D printing. In certain embodiments, a substantially continuous light-affecting element may include multiple different light-affecting sub-elements subject to being fabricated by three-dimensional printing, wherein the sub-elements may each be arranged to interact with separate solid state light emitter chips to yield different optical distributions for interactions between each specific emitter and its corresponding light affecting sub-element. In certain embodiments, multiple different light-affecting sub-elements subject to being fabricated by three-dimensional printing may be arranged to interact with multiple sub-groups of solid state emitter, wherein a first combination of a first solid state emitter sub-group and corresponding first light affecting element is arranged to yield a different optical distribution than a second combination of a second solid state emitter sub-ground and corresponding second light affecting element.

In certain embodiments, multiple light affecting elements may be formed simultaneously using multiple material deposition (e.g., 3D printing) heads over different solid state light emitters mounted on a single substrate. For example, a first deposition head may be used to deposit a first light affecting element on, over, or around the first solid state light emitter simultaneously with use of a second deposition head to deposit a second light affecting element on, over, or around a second solid state light emitter. Any suitable number of deposition heads may be used to simultaneously deposit a desired number of light affecting elements on, over, or around multiple solid state emitters mounted to a single substrate.

In certain embodiments, a lighting device includes at least one solid state light emitter arranged on or over a substrate; and at least one light affecting element arranged to receive at least a portion of emissions generated by the at least one solid state light emitter; wherein the at least one light affecting element includes a plurality of fused elements comprising a plurality of dots, rods, or layers, and the at least one light affecting element comprises at least one of: (i) a light-transmissive material deposited on at least one of the substrate and the at least one solid state light emitter and arranged to transmit at least a portion of a spectral output of the at least one solid state light emitter, (ii) a light-absorptive material deposited on at least one of the substrate and the at least one solid state light emitter and arranged to absorb at least a portion of a spectral output of the at least one solid state light emitter, and (iii) a light-reflective material deposited on or over the substrate and arranged to reflect at least a portion of a spectral output of the at least one solid state light emitter.

In certain embodiments, dots, rods, or layers may be formed by three-dimensional printing, with at least one outer dimension of individual dots, rods, or layers being less than about 100 micrometers, and with microscopic boundaries therebetween. In certain embodiments, a substrate may include electrically conductive regions formed by 3D printing. In certain embodiments, a substrate may include a metal core circuit board or a flexible circuit board (which may be substantially transparent).

In certain embodiments, selectively deposited materials may be used to form electrically conductive paths to one or more solid state emitters for conducting operating current to such emitters, such as to augment or replace wirebonds. In certain embodiments, at least one solid state light emitter may be arranged on or over substrate including multiple electrically conductive regions, wherein a proximal major surface of the at least one solid state emitter is arranged adjacent to the substrate, and a distal major surface of the at least one solid state emitter is arranged distal from the substrate; and at least one electrically conductive path between the at least one electrically conductive region and at least one electrical contact arranged along the distal surface, wherein the at least one electrically conductive path includes at least one fused electrically conductive element comprising a plurality of dots, rods, or layers. Microscopic boundaries between adjacent dots, rods, or layers may be provided, and each dot, rod, or layer may include an outer dimension of less than about 100 micrometers. Such dots, rods, or layers may be formed by 3D printing. An electrically insulating material arranged between at least one sidewall of the at least one electrically conductive solid state light emitter and the at least one fused electrically conductive element.

In certain embodiments, a single light affecting element may be arranged on, over, or around multiple solid state emitter chips (e.g., an array of solid state emitter chips at least one subgroup of an array). In certain embodiments, solid state emitter chips may be arranged with regular spacing; in other embodiments, at least some solid state emitter chips disposed on or over a single substrate may be arranged with irregular spacing. In certain embodiments, at least one light affecting element may be symmetrically arranged with respect to any single solid state emitter or group of solid state emitter thereunder; in alternative embodiments, at least one light affecting element may be asymmetrically arranged with respect to some or all solid state emitters arranged thereunder. In certain embodiments, emitters may be randomly arranged on or over a substrate.

In certain embodiments, lighting devices may include one or more solid state emitters with at least one light affecting element including a rectangular or trapezoidal light affecting element (e.g., light affecting element having a rectangular or trapezoidal cross-sectional shape), a substantially hemispherical light-affecting element, an oval shaped light-affecting element, a compound curve shaped light affecting element, or any other desired symmetrical or asymmetrical shape, wherein the at least one light affecting element is subject to formation by a selective deposition process such as 3D printing.

In certain embodiments, light affecting elements and/or contacts may be formed by 3D printing on or over (or under, depending on carrier orientation) one or both sides of a carrier or substrate.

In certain embodiment, one or more solid state emitters may include one or more recesses defined in a major (e.g., largest) light-emitting surface thereof to facilitate improved light extraction.

In certain embodiments, a solid state lighting device as disclosed herein may include a light affecting element embodying a primary optic (e.g., lens) formed by 3D printing, wherein the lighting device is devoid of a secondary optic (e.g., lens) in series with the primary optic. IN certain embodiments, a primary optic formed by 3D printing may be arranged on, over, or around (and arranged to receive emissions from) multiple solid state emitters (e.g., LEDs) disposed in an array. In certain embodiments, a primary optic may optionally be arranged for contact with an ambient air environment (or other environmental fluid) of a lighting device when in use.

In certain embodiments, a lighting device as disclosed herein may be interfaced to an AC-output lighting ballast. Exemplary embodiments of interfacing one or more LEDs to AC-output lighting ballasts are described in U.S. Patent Application Publication No. 2014/0204571A1 entitled "LED LIGHTING APPARATUS FOR USE WITH AC-OUTPUT LIGHTING BALLASTS" by Zhang et al., based on U.S. patent application Ser. No. 13/943,455 filed concurrently with this application, wherein the disclosures of the foregoing publication and application are hereby incorporated by reference herein in their entireties.

In certain embodiments, a lighting device as disclosed herein may be interfaced to a fluorescent emergency lighting ballast. Exemplary embodiments of interfacing LED strings to fluorescent emergency lighting ballasts are described U.S. Patent Application Publication No. 2014/0132164A1 entitled "EMERGENCY LIGHTING CONVERSION FOR LED STRINGS" by McBryde et al., based on U.S. patent application Ser. No. 13/943,376 filed concurrently with this application, wherein the disclosures of the foregoing publication and application are hereby incorporated by reference herein in their entireties.

In certain embodiments, a lighting device as disclosed herein may be used as a LED-based lamp in a fluorescent lighting system. Exemplary embodiments of a lamp suitable for use as an LED based lamp in a fluorescent lighting system are described in U.S. Patent Application Publication No. 2015/0003069 entitled "LED LAMP" by Melendorp et al., based on U.S. patent application Ser. No. 13/943,152 filed concurrently with this application, wherein the disclosures of the foregoing publication and application are hereby incorporated by reference herein in their entireties.

In certain embodiments, a lighting device as disclosed herein may be used to illuminate an object, a space, or an environment.

Various illustrative features are described below in connection with the accompanying figures.

FIG. 1 illustrates various components of a three-dimensional printing system 150 for fabricating solid state lighting devices according to the present invention, including devices including one or more light affecting elements including fused layers, dots, or rods with dimensions of less than or equal to about 100 micrometers. The system 150 may include a computer aided design (CAD) module 151 or other design module, a controller 152, and a printing apparatus 160. The controller 152 may prepare digital data (i.e., data characterizing a 3D object) for printing, and control operation of the printing apparatus 160. Control functionality may be distributed across multiple units in certain embodiments. The controller 152 may include a central processing unit 154, a memory 155, software 156, and a communications unit 177. Various elements of the controller 152 may be embodied in a computing device such as a personal computer or other workstation. The communication unit 177 may, for example, enable transfer of data and instructions between the controller 152 and the CAD module 151, between the controller 152 and the printing apparatus 160 (or components thereof), and/or between the controller 152 and other elements of the system 150.

The printing apparatus 160 may include positioner(s) 161, material dispenser(s) 163A-163B, material supply unit(s) 162A-162B, printing head(s) 165A-165B, printing nozzle(s) 166A-166B, leveler(s) 167, curer(s) 168, and other suitable components. Although only two material dispensers 163A-163B and printing heads 165A-165B are shown, it is to be appreciated that a printing apparatus 160 may include any suitable number of components to dispense any desired number of materials over one or more substrate portions and/or solid state light emitters. The positioner(s) 161, or other suitable movement devices, may control the movement of the printing head(s) 165A-165B, leveler(s) 167, and/or curer(s) 168. Leveler(s) 167 may include, for example, a roller or blade or other suitable leveling mechanism. Printing head(s) 165A-165B may include, for example, ink jet heads or other suitable printing heads through which deposition materials are dispensed. Printing head(s) 165A-165B and dispenser(s) 163A-163B may draw material(s) to be deposited from one or more reservoirs or cartridges. One or more curer(s) 168 may include an electromagnetic radiation mechanism for optionally curing or fusing deposited materials (e.g., as layers, dots, or rods). Any suitable deposition materials may be used, including (but not limited to) liquids, powders, slurries, photopolymers, plastics, metals, resins, epoxies, and any other desired materials. Material dispensing locations, directions, and the amount and/or type of material(s) to be deposited may be controlled by the 152 controller as preprogrammed from a 3-D data file (e.g., as may be generated using the CAD module 151. Dimensions of each deposited unit (e.g., layers, dots, or rods) may be controlled by selectively adjusting the output nozzles 166A-166B. In certain embodiments, a one or more levelers 167 may follow in the path of the printing heads 165A-166A, and may be used to flatten the most recently laid layer of materials before curing, thereby ensuring consistent 'spread' of the materials within the layer, in preparation for the deposit of the next layer of materials. Excess interface material gathered by the leveling device may be cleaned off the leveling device and discarded or recycled.

When printing, the printing head(s) 165A-165B may move in two dimensions (e.g., X-Y) or three dimensions (e.g., X-Y-Z) depositing materials in the course of passage of the printing heads 165A-165B passage over a substrate or print surface 105. In certain embodiments, one or more printing heads 165A-165B may be arranged or positionable at an angle other than 90 degrees relative to a substrate or print surface 105. Passage of the printing head(s) 165A-165B may be followed by curing of deposited material by a source of electromagnetic radiation or heat (e.g., provided by curer(s) 168), or hardening chemical (e.g., provided by printing head(s) 165A-165B). Printing of an object may include dispensing one or more materials on or over a substrate (or on or over solid state light emitters) in discrete locations (e.g., as layers, dots, or rods) according to a predetermined configuration from nozzles 166A-166B associated with printing heads 165A-165B. Material(s) may be dispensed at a desired temperature in a fluid or powdered state to form a layer, and after dispensing each layer may optionally be cured by, for example, a source of electromagnetic radiation, heat, or chemical(s). In certain embodiments, one or more materials may be dispensed at a temperature above a glass transition state of the dispensed materials. The deposited material(s) may solidify to form fused material(s) as a result of curing and/or subsequent cooling (which may be aided by a supply of cooling air or other gas).

FIG. 2A illustrates multiple solid state emitter chips 210A-2100 arranged on a substrate 205 of at least a portion of a solid state lighting device 200, with multiple dispensing heads 265A-265C arranged to deposit material on or over the substrate 205 and/or emitter chips 210A-2100. As shown, the dispensing heads 265A-265C may be arranged at various positions and orientations relative to the emitter chips 210A-2100 and substrate 205, including at angles other than 90 degrees (e.g., with dispensing head 265C arranged at approximately 45 degrees relative to the substrate 205). Multiple dispensing heads may be arranged to simultaneously dispense material over one or more emitter chips 210A-210O and/or regions of the substrate 205; for example, a first dispensing head 265A may be arranged to dispense material on, over, or around one emitter chip 210B while a second dispensing head 265B and third dispensing head 265C may be arranged to dispense material on, over, or around another emitter chip 210C. The emitter chips 210A-210O may vary with respect to any characteristics (e.g., die size (top emissive area), peak wavelength, bin, presence or absence of lumiphoric material, etc.). As shown in FIG. 2A, a light affecting element 214C (such as a primary optic or other lens including a substantially light-transmissive material) may be formed on or over one or more solid state light emitter chips (e.g., chip 210C) and/or portions of the substrate 205. Such light affecting element 214C may be formed of multiple tubes (such as shown in FIG. 2B), multiple layers (such as shown in FIG. 2C), or multiple dots (e.g., such as shown in FIG. 4B). In certain embodiments, tubes, layers, or dots may each include at least one dimension of less than about 100 micrometers. In certain embodiments, one or more light affecting elements may be substantially uniform in character; in other embodiments, one or more light affecting elements may be intentionally formed to be non-uniform in character, such as through inclusion of different materials in discrete areas of a light affecting element. In certain embodiments, one or more light affecting elements 214C may include lumiphoric materials, light transmissive materials, light scattering materials, light absorbing materials, light reflecting materials, or the like.

FIG. 3A illustrates a dispensing head 365A and a curing element 368 (e.g., laser curing element) of a three-dimensional printing system proximate to a portion of a first subassembly 300A of a solid state lighting device in a first state of manufacture, including formation of electrically conductive traces 302A-302O over a carrier 301 to form a substrate 305 over which one or more solid state light emitter chips 310 may be arranged. In certain embodiments, electrically conductive traces 302A-302O may be separated by gaps 303; in other embodiments, electrically insulating material and/or thermally conductive paste may be provided in at least certain spaces 303 between electrically conductive traces 302A-302C. Electrically conductive traces 302A-302C may be formed of suitable electrically conductive materials such as one or more metals (e.g., gold, copper, silver, aluminum, titanium, or the like) or electrically conductive polymers. In certain embodiments, the carrier 301 may be formed of a flexible material such as polymeric film, and such flexible material may be substantially optically transmissive of one or more wavelengths output by solid state light emitter chips 310 arranged on or over the substrate 305. One or more solid state light emitter chips 310 may be mounted to the substrate 305 and electrical connections may be made to the chip(s) 310 by any suitable methods including soldering (optionally by way of wirebonds (not shown)) or three-dimensional printing of electrically conductive paths (as disclosed herein in connection with FIG. 8). In certain embodiments, material may be deposited by one or more dispensing heads (e.g., dispensing head 365A on or over the substrate 305 in the form of particles and/or liquids, and the deposited material may be fused or otherwise cured using a curing element 368, which may include a source of electromagnetic radiation (e.g., laser) and/or heat source. The process of deposition and curing (with optional removal of excess material) may be repeated as many times as necessary to form features (e.g., light affecting elements, electrically conductive contacts or paths, etc.) of any desired number, size, and shape.

Figure 3B:
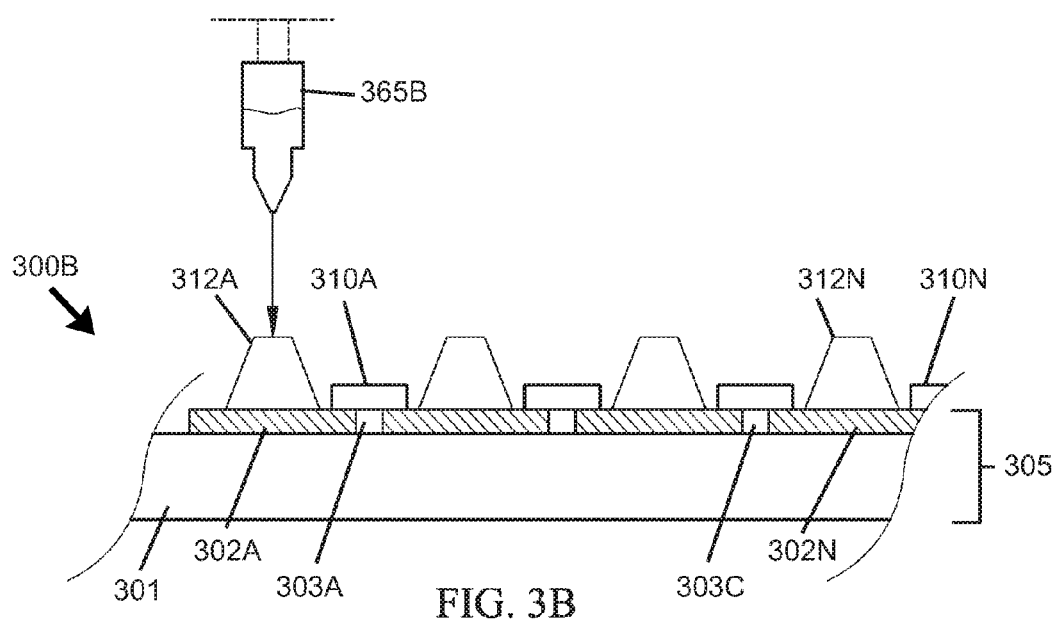
FIG. 3B is a cross-sectional schematic view of a dispensing head of a three-dimensional printing system proximate to a portion of a second subassembly of a solid state lighting device (following further processing of the subassembly of FIG. 3A) including formation of reflective and/or absorptive light affecting elements over the substrate proximate to solid state light emitter chips.

FIG. 3B illustrates a dispensing head 365B of a three-dimensional printing system proximate to a portion of a second subassembly 300B of a solid state lighting device (following further processing of the subassembly 300A of FIG. 3A) including formation of reflective and/or absorptive light affecting elements 312A-312N over the substrate proximate to solid state light emitter chips 310A-310N arranged over a substrate 305 that includes a carrier 301 and electrically conductive traces 302A-302N arranged thereon. As shown in FIG. 3B, multiple light affecting elements 312A-312N, multiple solid state light emitter chips 310A-310N, and multiple electrically conductive traces 302A-302N are shown, wherein the suffix N represents an arbitrary number, since it is to be understood that any suitable number of elements could be provided (and this convention is used elsewhere in this document). Following mounting of solid state light emitter chips 310A-310N to the substrate 305, light affecting elements 312A-312N are formed on the substrate 305 around the solid state light emitter chips 310A-310N by 3D printing using one or more dispensing heads 365B. In certain embodiments, the light affecting elements 312A-312N include sloping sidewalls arranged to interact with light received from the solid state light emitter chips 310A-310N, such as by reflecting or absorbing light. In certain embodiments, at least one light affecting element includes multiple non-coplanar light reflective surfaces (such as, but not limited to, a curved wall reflector and/or a faceted reflector). In certain embodiments, each light affecting element 312A-312N forms a cup or dam arranged to hold a dispensed material (e.g., encapsulant material). In certain embodiments, light affecting elements 312A-312N with different properties (e.g., size, shape, material, light reflection characteristics, and/or light absorption characteristics) may be arranged proximate to different solid state emitter chips 310A-310N to alter light distribution characteristics output by different solid state emitter chip/light affecting element combinations.

Figure 3C:
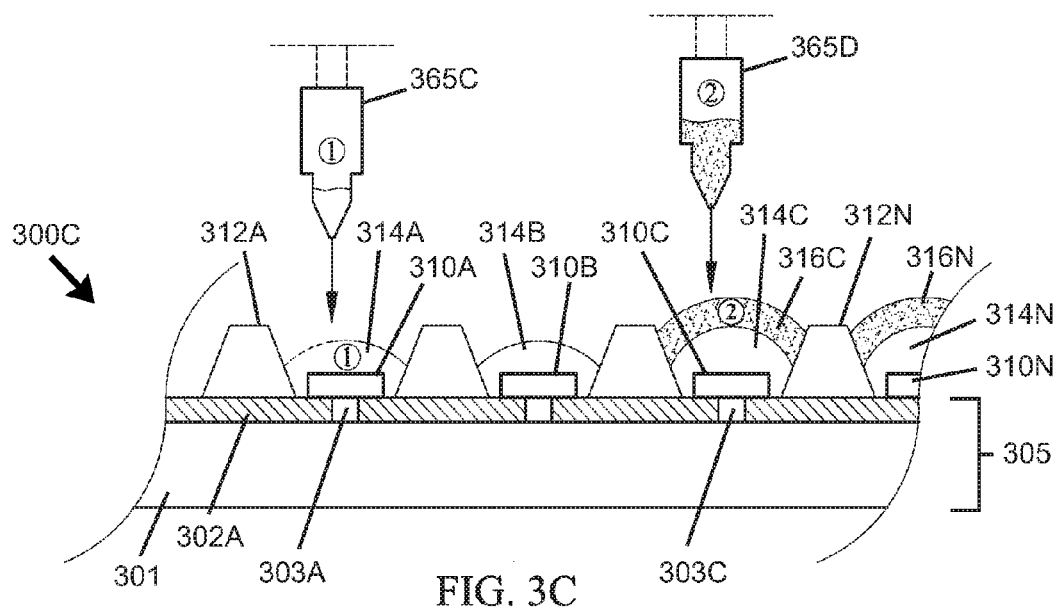
FIG. 3C is a cross-sectional schematic view of multiple dispensing heads of a three-dimensional printing system proximate to a portion of a third subassembly of a solid state lighting device (following further processing of the subassembly of FIG. 3B) including application of encapsulant material over the solid state light emitter chips and application of lumiphoric material over the encapsulant material.

FIG. 3C illustrates multiple dispensing heads 365C-365D of a three-dimensional printing system proximate to a portion of a third subassembly 300C of a solid state lighting device (following further processing of the subassembly 300B of FIG. 3B) including application of encapsulant material 314A-314N over the solid state light emitter chips 310A-310N and application of lumiphoric material 316C-316N over at least certain instances of encapsulant material 314C-314N. Encapsulant material 314A-314N may be deposited from at least one dispensing head 365C (including material 1) between previously-deposited raised light affecting elements 312A-312N by 3D printing; alternatively, if the light-affecting elements 312A-312N embody cups or dams, the encapsulant material regions 314A-314N may be deposited by other deposition techniques such as conventional liquid dispensing for containment of liquid within recesses defined in or among the light affecting elements 312A-312N. Following curing of the encapsulant material regions 314A-314N, lumiphoric material-containing regions 316C-316N may be formed (e.g., by deposition of material 2 by dispensing head 365D) over some or all of the encapsulant material regions 314A-314N, to form lumiphoric material regions that are spatially segregated (i.e., separated from) the solid state emitter chips 310A-310N. Regions 303A-303O below solid state emitter chips 310A-310N may include electrically insulating material to prevent short-circuiting between adjacent traces 302A-303N. In certain embodiments, the raised light-affecting elements 312A-312N may be formed at least in part of thermally conductive material to additional serve as heatsinks elements for dissipation of heat generated by the solid state emitter chips 310A-310N. In certain embodiments, materials providing heatsinking utility preferably include a thermal conductivity of at least 50 W/m-C and are arranged in conductive thermal communication with at least one solid state light emitter of a lighting device to dissipate heat generated by the emitter(s) to an ambient air environment.

Figure 4A:
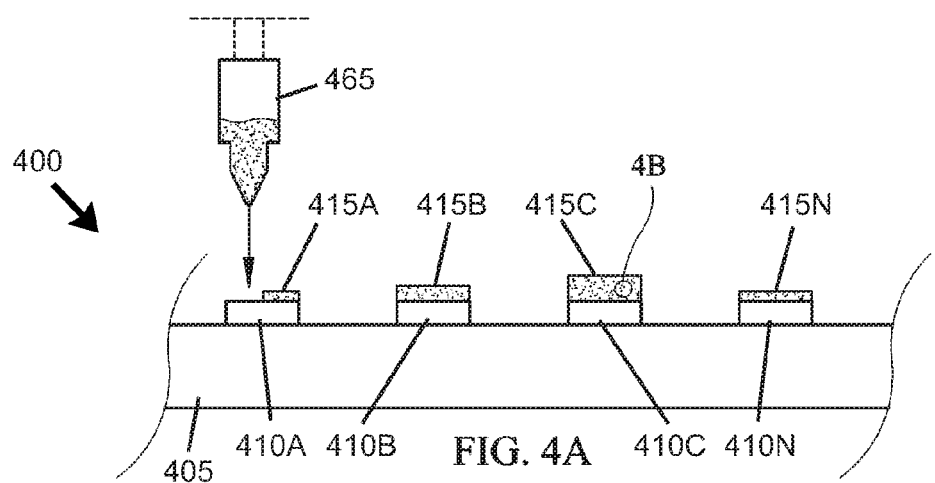
FIG. 4A is a cross-sectional schematic view of a dispensing head of a three-dimensional printing system proximate to a portion of a solid state lighting device including multiple solid state light emitters, wherein different solid state light emitters include non-identical light affecting elements deposited thereon.
Figure 4B:
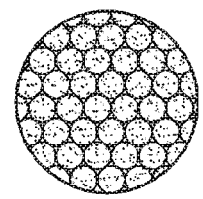
FIG. 4B is a magnified cross-sectional schematic view of a portion of a light affecting element illustrated in FIG. 4B, including printed material arranged as fused dots deposited on or over a portion of a solid state light emitter.

FIG. 4A illustrates a dispensing head 465 of a three-dimensional printing system proximate to a portion of a solid state lighting device 400 including multiple solid state light emitters 410A-410N mounted to a substrate 405, wherein different solid state light emitters 410A-410N include non-identical light affecting elements 415A-415N (e.g., differing in thickness and/or lateral coverage) deposited on the solid state light emitters 410A-410N following the mounting of the emitters 410A-410N to the substrate 405. In certain embodiments, individual light affecting elements 415A-415N may differ with respect to one or more of the following parameters: material composition, material concentration, thickness, and shape. In certain embodiments, at least one light affecting element includes multiple different compositionally different materials deposited in discrete areas of the light affecting element(s). In certain embodiments, one or more properties of individual light affecting elements 415A-415N may be tailored or adjusted during manufacture based on one or more properties of individual solid state light emitters 410A-410N. In certain embodiments, one or more properties of individual light affecting elements 415A-415N may be adjusted to reduce or attenuate differences in output characteristics (e.g., peak wavelength, full-width/half maximum properties, optical distribution, or the like) of different emitter/light affecting element combinations. In certain embodiments, different light affecting elements 415A-415N may be arranged to interact with different solid state light emitters 410A-410N, respectively, to create multiple different optical distributions.

FIG. 4B is a magnified cross-sectional illustration of a portion of one light affecting element 415C illustrated in FIG. 4B, including printed material arranged as fused dots deposited on or over a portion of a solid state light emitter 410C.

In certain embodiments, 3D printing may be used to generate one or more free-standing light affecting elements that may span over or across a solid state light emitter with a portion of the light affecting element(s) being unsupported by an underlying material (i.e., with a portion of the light affecting element(s) extending or spanning over a gap). Such a feature may be beneficial, for example, to provide a lumiphoric material that has little or no conductive thermal communication with a solid state light emitter (e.g., a LED).

Figure 5:
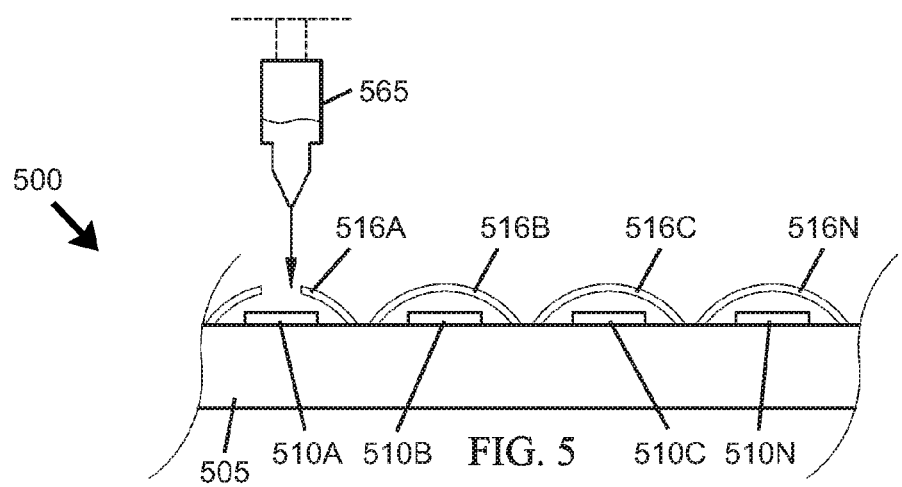
FIG. 5 is a cross-sectional schematic view of a dispensing head of a three-dimensional printing system proximate to a portion of a solid state lighting device including multiple solid state light emitters and light affecting elements formed on the substrate and arranged to cover the solid state light emitters without contacting the solid state light emitters.

FIG. 5 illustrates a dispensing head 565 of a three-dimensional printing system proximate to a portion of a solid state lighting device 500 including multiple solid state light emitters 510A-510N and light affecting elements 516A-516N formed on the substrate 505 and arranged to cover the solid state light emitters 510A-510N without contacting the solid state light emitters 510A-510N (i.e., with a gap or void disposed between each solid state emitter 510A-510N and a corresponding light affecting element 516A-516N. In certain embodiments, gaps or voids initially formed by 3D printing between one or more solid state light emitters and one or more free-standing light affecting elements may be subsequently filled (e.g., by injection of liquid material) with encapsulant or another desired light-transmissive material.

In certain embodiments, 3D printing may be used to create light affecting elements imparting different optical distributions to solid state light emitters over, on, or around which the light affecting elements are applied. Light affecting elements with differing material composition, material concentration, thickness, and/or shape may be deposited on, over, or around different solid state light emitters.

Figure 6:
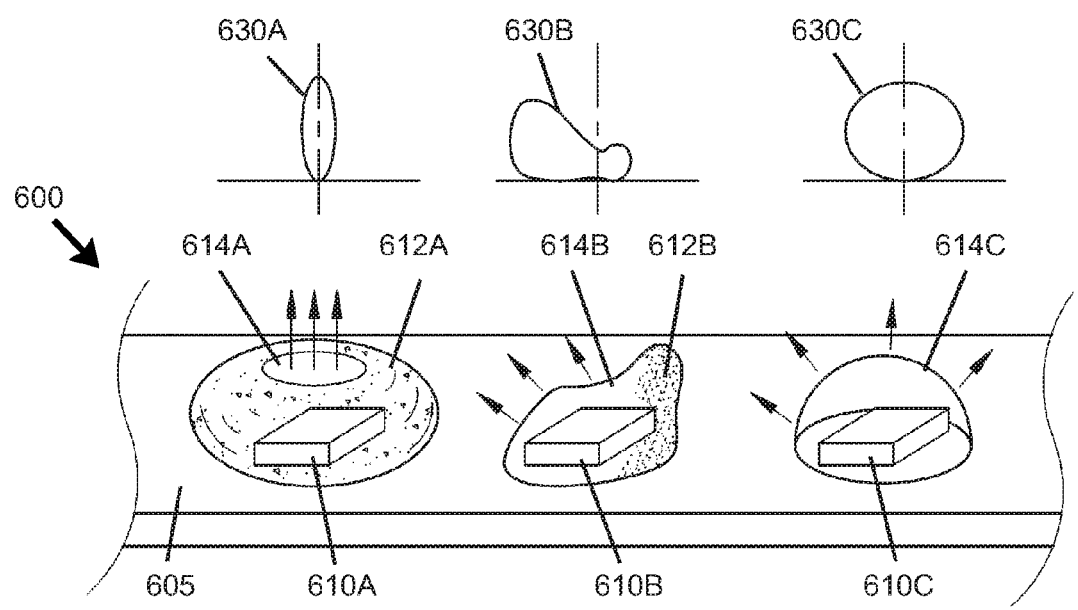
FIG. 6 is a perspective schematic view of a portion of a solid state lighting device including multiple light affecting elements separately arranged on, over, or around multiple solid state light emitters to yield a different optical distribution for each solid state light emitter and associated light affecting element(s).

FIG. 6 illustrates a portion of a solid state lighting device 600 including multiple light affecting elements 612A, 614A, 612B, 614B, 614C arranged on, over, or around multiple solid state light emitters 610A-610O mounted to a substrate 605 to yield a different optical distribution 630A-630O for each combination of a solid state light emitter and associated light affecting element(s) (i.e., emitter 610A in combination with light affecting elements 612A, 6141; emitter 610B in combination with light affecting elements 612B, 614B; and emitter 610C in combination with light affecting element 614C). In one combination, light affecting elements 612A, 614A are arranged to interact with emissions of a first solid state light emitter 610A to yield a first optical distribution 630A that is narrowly focused. In particular, an annularly shaped light affecting element 612A is arranged to reflect or absorb emissions of the solid state light emitter 610A, while a substantially cylindrical or conical shaped light affecting element 614A comprising a light transmissive material is centrally arranged over the solid state light emitter 610A. In another combination, light affecting elements 612B, 614B are arranged to interact with emissions of a second solid state light emitter 610B to yield an asymmetric optical distribution 630B. One light affecting element 612B comprising a light reflective or light absorptive material is arranged to one side of the solid state light emitter 610B, while another light affecting element 614B comprising a substantially light transmissive material is arranged over and around a remainder of the solid state light emitter 610B. Since a light reflective or light absorptive material 612B is provided to one side of the solid state light emitter 610B, the optical distribution 630B includes very little light output corresponding to the position of such reflective or absorptive material 612B. In yet another combination, a light affecting element 614C is arranged to interact with emissions of a third solid state light emitter 610C to yield a symmetric optical distribution 630C that differs from both the first optical distribution 630A and second optical distribution 630B.

In certain embodiments, multiple lighting devices may be fabricated according to a substantially continuous process including selective material deposition, such as by 3D printing. In certain embodiments, one or more substrates may travel in or through multiple processing stations including at least one 3D processing station (and preferably multiple 3D processing stations), preferably including multiple material dispensing heads to permit fabrication of multiple lighting devices in parallel.

Figure 7:
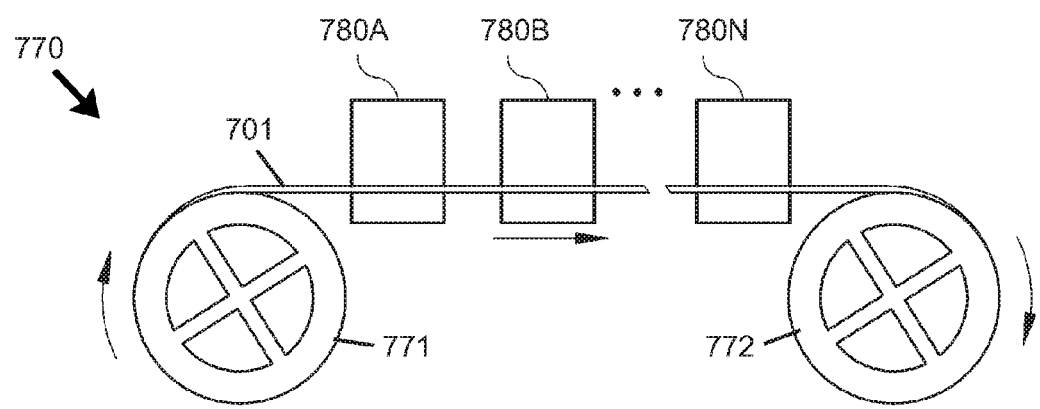
FIG. 7 is a schematic elevation view of a reel-to-reel solid state lighting device fabrication system including at least one three-dimensional printing apparatus.

FIG. 7 illustrates reel-to-reel solid state lighting device fabrication system 770 including a supply reel 771 and a receiving reel 772 arranged to convey a flexible carrier 701 (or prefabricated substrate) in or through multiple processing stations 780A-780N including at least one 3D printing station. In one embodiment, a carrier 701 is supplied to a first 3D processing station 780A arranged to print electrical traces on the carrier 701 to form a substrate. Subsequent processing stations may be used to mount solid state light emitters (e.g., LED dies) to the substrate, to make electrical connections between the solid state light emitters and electrical traces, to deposit various light affecting elements, to add heatsink regions, and/or to add supporting components (e.g., control circuits, driver circuits, etc.). When the carrier 701 with traces, solid state light emitters, light affecting elements, and/or related circuits formed over the carrier 701 exits the last processing station 780N, the resulting combination includes multiple light emitting devices that may be gathered on the receiving reel 772 for subsequent processing (e.g., separation or singulation into separate lighting devices, integration with other elements, packaging) and/or use. Although FIG. 7 depicts a reel-to-reel fabrication system 770 suitable for use with flexible carriers, it is to be appreciated that in certain embodiments multiple processing stations including at least one 3D printing station may be used for substantially continuous fabrication of multiple lighting devices arranged on substrates of any suitable type including rigid circuit boards (including but not limited to metal core PCBs) using appropriate circuit board handling equipment.

In certain embodiments, electrically conductive paths between conductive regions of a substrate and a distal major surface (e.g., top side) of a LED mounted on the substrate may include fused conductive dots, rods, or layers (such as may be formed by 3D printing), thereby augmenting or eliminating the need for wirebonds.

Figure 8:
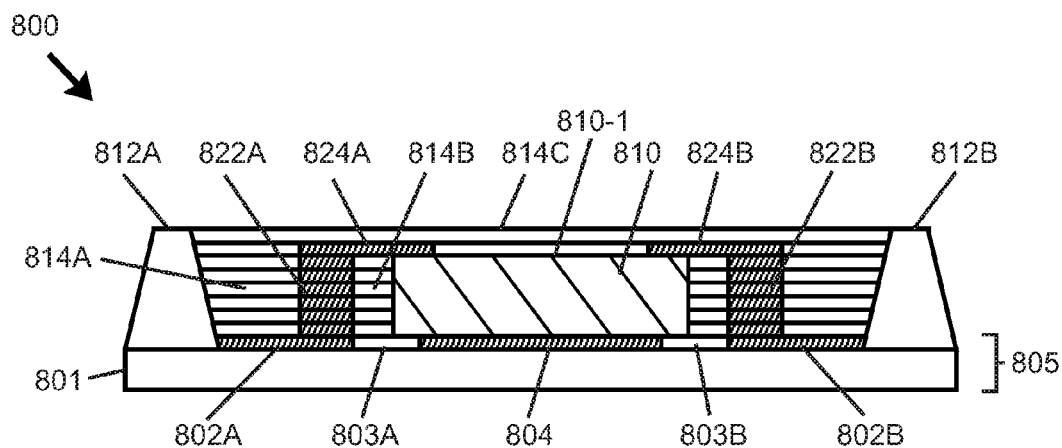
FIG. 8 is a side cross-sectional schematic view of a solid state lighting device including three-dimensionally printed light affecting elements and at least one electrically conductive path to at least one topside contact of a solid state light emitter chip.

FIG. 8 illustrates a solid state lighting device 800 including 3D printed light affecting elements 812A-812B, 814A-814C and 3D printed electrically conductive path segments 822A, 824A, 822B, 824B to at least one topside contact of a solid state light emitter chip 810 mounted to a substrate 805 that includes a carrier 801 and electrically conductive regions (e.g., traces) 802A-802B. To form the lighting device 800, the carrier 801 may be processed by 3D printing to deposit electrically conductive regions 802A-802B thereon. The carrier 801 may also include a thermally conductive and/or electrically conductive emitter mounting region 804 centrally arranged below the solid state light emitter chip and spaced apart from the conductive traces 802A-802B by insulating regions 803A-803B, which may also be formed by 3D printing. In certain embodiments, the emitter mounting region 804 may comprise an electrically conductive region such as an additional conductive trace and/or electrically conductive paste. If no electrical contact is provided on the bottom side of the emitter chip 810, then the emitter mounting region 804 may include thermally conductive paste. A solid state light emitter (e.g., LED) chip 810 may be mounted to the substrate 805 in contact with the emitter mounting region 804. Light affecting regions 812A-812B (which may include at least one light reflective and/or light absorptive material) may be formed on the substrate 305 by 3D printing. Light affecting regions 814A-814C and electrically conductive path segments 822A, 824A, 822B, 824B may also be formed by 3D printing over the substrate 805 and over or around the solid state light emitter chip 810. Light affecting regions 814A-814C are preferably formed at least in part of at least one substantially light-transmissive material. An intermediate light affecting region 814A may be arranged between the conductive path segments 822A, 822B and the peripherally outer light affecting regions 812A-812B, and an inner light affecting region 814B may be arranged between sidewalls of the solid state emitter chip 810 and the electrically conductive path segments 822A-822B, with the inner light affecting region 814B preferably comprising an electrically insulating material. Topside electrical segments 824A, 824B may be arranged to make conductive electrical contact between conductive path segments 822A, 822B and one or more topside contacts (not shown) associated with the distal (e.g., upper) major surface 810-1 of the solid state light emitter chip 810. In operation of the lighting device 800, electric current may flow through traces 802A, 802B, conductive path segments 822A, 822B, and topside electrical segments 824A, 824B to yield at least one electrically conductive path between the substrate 805 and topside contacts (not shown) along the distal (or upper) major surface 810-1 of the solid state emitter chip 810. If the solid state emitter chip 810 is a vertical device (with vertical flow of current), then current may flow though the chip 810 to a bottom side contact embodied in the emitter mounting region 804. Light emissions generated by the solid state emitter chip 810 may be emitted laterally (past conductive path segments 822A, 822B) and through light affecting elements 824A, 824B to impinge on light affecting elements 812A, 812B, which preferably reflect such light (e.g., in a forward or upward direction to exit the device) or absorb such light, and emissions generated by the chip 810 may also be emitted upward past the topside electrical segments 824A, 824B and through the light affecting element 814C to exit the lighting device 800. Any suitable number of electrically conductive path segments 822A, 824A may be arranged in series or parallel as necessary to meet the electrical current handling requirements for the emitter chip 810. Although various sequential layers are depicted in FIG. 8 for ease of illustrating features of the invention, it is to be appreciated that layers are not necessarily to scale, and that boundaries between layers formed by 3D printing would typically not be visible with the naked eye (e.g., without aid of a microscope or similar magnification or imaging device), since in certain embodiments individual dots, rods, or layers may have dimensions of less than about 100 micrometers.

Figure 9:
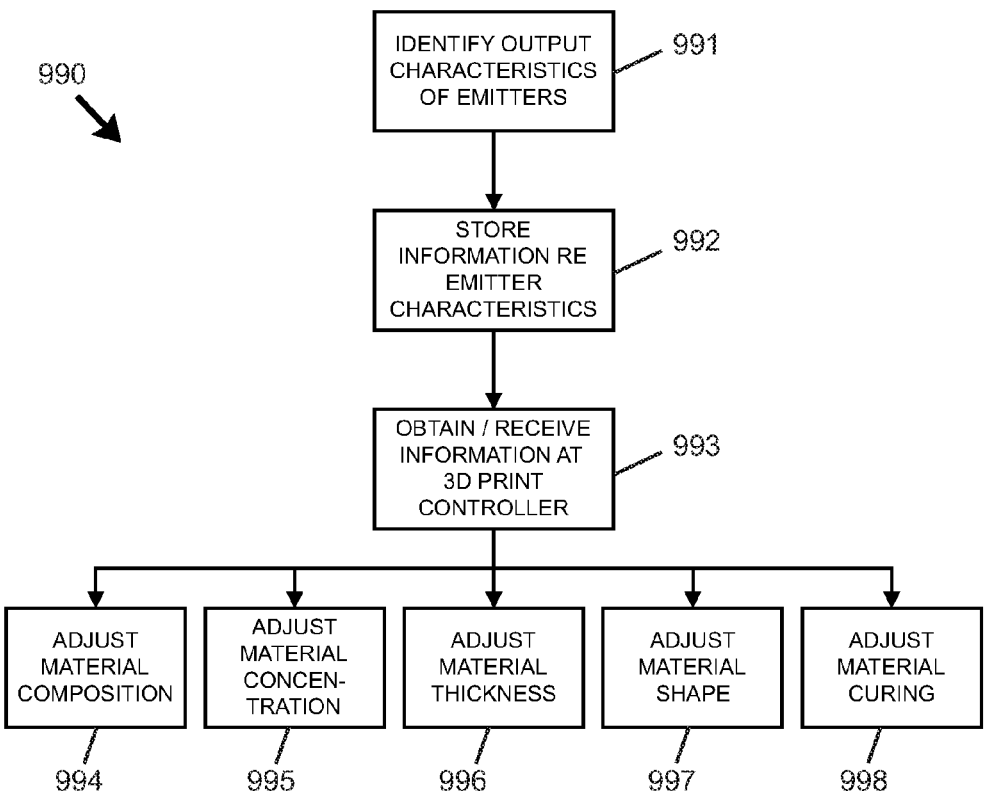
FIG. 9 is a process flow diagram including various steps of a method for fabricating at least one solid state lighting device including light affecting elements individually tailored to different solid state light emitters.

FIG. 9 illustrates various steps of a method 990 for fabricating at least one solid state lighting device including light affecting elements individually tailored to different solid state light emitters. Although various steps 991-998 are described, it is to be appreciated that in certain embodiments some steps may be omitted and in other embodiments one or more steps may be added. A first method step 991 may include identifying one or more output characteristics of multiple solid state light emitters (e.g., LED chips), such as by testing such emitters using one or more photometers and/or other instruments. A second method step 992 includes storing information indicative of emitter characteristics obtained by the preceding step 991. Such step 992 may include storing information in a memory device physically coupled to a package for multiple solid state emitter chips; alternatively, such step may include storing information in a data repository not coupled to a package for emitter chips. A third method step 993 includes obtaining or receiving information indicative of output characteristics of multiple different solid state light emitters. Such step 993 is preferably automated with software, with specific emitter characteristics corresponding or otherwise correlated to specific LEDs positioned in a one-dimensional or multi-dimensional array. Additional steps include adjusting one or more characteristics of at least one light affecting element (and preferably characteristics of multiple different light affecting elements) based on the information indicative of output characteristics of the solid state light emitters, such as adjusting material composition according to step 994, adjusting material concentration according to step 995, adjusting material thickness according to step 996, adjusting material shape according to step 997, and/or adjusting material curing according to step 998, to yield a lighting device wherein at least one of material composition, material concentration, material curing, thickness, and shape differs among the multiple different light affecting elements. The preceding characteristics may be adjusted on an emitter-specific basis utilizing a selective material deposition process such as 3D printing. Other characteristics of light affecting elements may be adjusted responsive to information indicative of output characteristics of solid state light emitters.

In certain embodiments, lighting devices may include one or more solid state emitters with at least one light affecting element including a rectangular or trapezoidal lens (e.g., lens having a rectangular or trapezoidal cross-sectional shape) arranged on, over, or around the one or more solid state emitters and subject to being fabricated by a selective deposition process such as 3D printing. In certain embodiment, one or more solid state emitters may include one or more recesses defined in a major (e.g., largest) light-emitting surface thereof to facilitate improved light extraction. In certain embodiments, light affecting elements and/or contacts may be formed by 3D printing on or over (or under, depending on carrier orientation) one or both sides of a carrier or substrate.

Figure 10C:
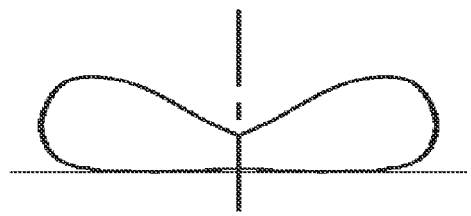
FIG. 10C is a light distribution diagram for an exemplary optical distribution that may be obtained from the lighting device of FIGS. 10A-10B.
Figure 10A:
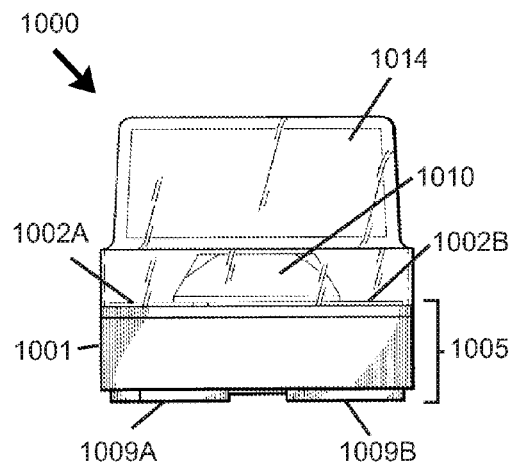
FIG. 10A is a side elevation view of a solid state lighting device including a single solid state light emitter chip arranged under or within a light affecting element including a rectangular lens subject to being fabricated by three-dimensional printing.
Figure 10B:
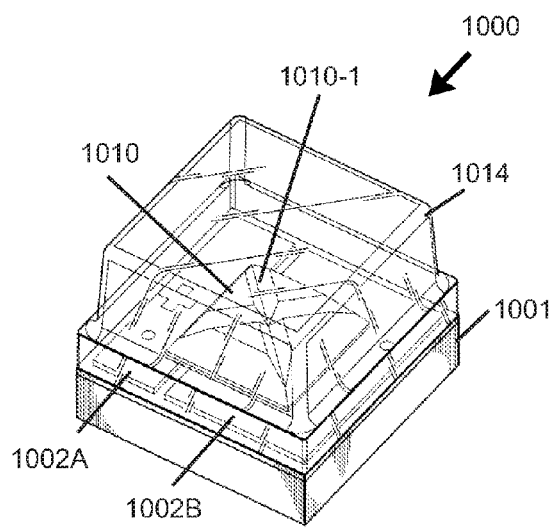
FIG. 10B is a perspective view of the solid state lighting device of FIG. 10A.

FIGS. 10A-10B illustrate a solid state lighting device 1000 including a single solid state light emitter chip 1010 arranged under or within a light affecting element 1014 including (or embodying) a rectangular lens subject to being fabricated by 3D printing. The light emitter chip 1010 includes recesses 1010-1 formed in a top major (e.g., largest) light emitting surface thereof to promote increased light extraction. The light emitter chip 1010 is arranged over upper surface contacts 1002A-1002B of a substrate 1005 that also includes a base element or carrier 1001 and lower surface contacts 1009A-1009B. The carrier 1001 of the substrate 1005 may be formed of a rigid or substantially non-rigid (e.g., flexible) material. Any one or more of the light affecting element 1014 and the contacts 1002A-1002B, 1009A-1009B may be fabricated by 3D printing.

FIG. 100 is light distribution diagram for an exemplary optical distribution that may be obtained from the lighting device 1000 of FIGS. 10A-10B.

Figure 11A:
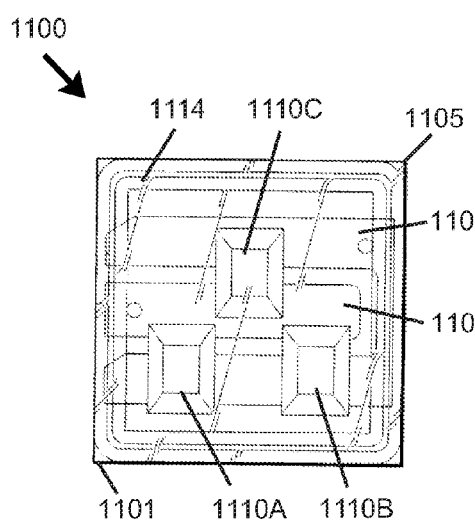
FIG. 11A is a top plan view of a solid state lighting device including a multiple solid state light emitter chips arranged under a rectangular light affecting element subject to being fabricated by three-dimensional printing.
Figure 11B:
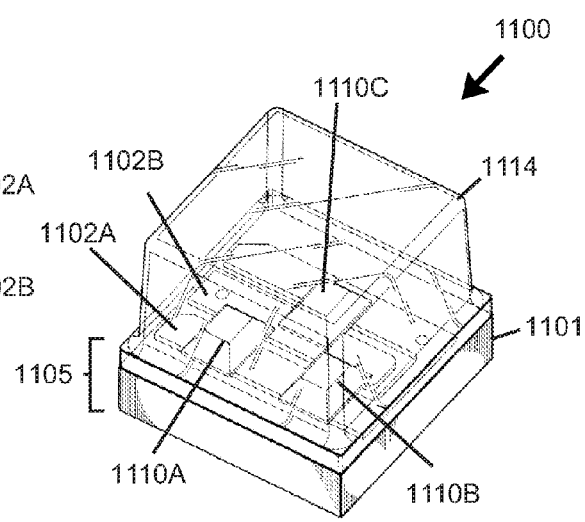
FIG. 11B is a perspective view of the solid state lighting device of FIG. 11A.

FIGS. 11A-11B illustrate a solid state lighting device 1100 including multiple solid state light emitter chips 1110A-1110C arranged under or within a light affecting element 1114 including (or embodying) a rectangular lens subject to being fabricated by 3D printing. The light emitter chip 1110 is arranged over upper surface contacts 1102A-1102B (including U-shaped contact 1102A) of a substrate 1105 that also includes a base element or carrier 1101 and lower surface contacts (not shown).

In certain embodiments, lighting devices may include one or more solid state light emitters with at least one light affecting element including an asymmetric curved lens subject to being fabricated by three-dimensional printing. In certain embodiments, multiple solid state light emitter chips may be arranged in a two-dimensional array with at least one light-affecting element arranged on, over, or around the multiple solid state light emitter chips or subgroups thereof, wherein the at least one light-affecting element may be fabricated by 3D printing.

FIGS. 12A-12C illustrate a solid state lighting device 1200 including multiple solid state light emitter chips 1210A-1210N disposed in a two-dimensional array and arranged under or within a light affecting element 1214 including an asymmetric curved lens subject to being fabricated by three-dimensional printing. The lens 1214 is partially (laterally) symmetric about a lateral dividing line, but asymmetric in a front-to-back direction (as shown in FIG. 12C). The lighting device 1200 includes lower surface contacts 1209A-1209B and a lower surface heat transfer surface 1204, of which one or all of the foregoing may be fabricated by 3D printing over (or under) a carrier or base material 1201 to form a substrate 1205.

In certain embodiments, multiple solid state light emitter chips arranged under or within a substantially continuous light-affecting element subject to being fabricated by 3D printing. In certain embodiments, a substantially continuous light-affecting element may include multiple different light-affecting sub-elements subject to being fabricated by three-dimensional printing, wherein the sub-elements may each be arranged to interact with separate solid state light emitter chips to yield different optical distributions for interactions between each specific emitter and its corresponding light affecting sub-element. In certain embodiments, multiple different light-affecting sub-elements subject to being fabricated by three-dimensional printing may be arranged to interact with multiple sub-groups of solid state emitter, wherein a first combination of a first solid state emitter sub-group and corresponding first light affecting element is arranged to yield a different optical distribution than a second combination of a second solid state emitter sub-ground and corresponding second light affecting element.

FIG. 13 illustrates at least a portion of a solid state lighting device 1300 including multiple solid state light emitter chips 1310A-1310C disposed over a substrate 1305 and arranged under or within a substantially continuous light affecting element 1314 including different light-affecting sub-elements 1314A-1314C subject to being fabricated by three-dimensional printing, wherein the light-affecting sub-elements 1314A-1314C are arranged to separately interact with the solid state light emitter chips 1310A-1310C to yield different optical distributions for interactions between each specific emitter chip 1310A-1310C and its corresponding light affecting sub-element 1314A-1314C. As shown in FIG. 13, the light affecting sub-elements 1314A-1314C may vary in curvature, concavity/convexity, and/or texturing. Additionally, or alternatively, light affecting sub-elements 1314A-1314C may vary with respect to presence or concentration of coatings and/or specific materials of construction (including but not limited lumiphoric materials), such that the light affecting element 1314 may be formed of multiple compositionally different materials arranged in different locations.

In certain embodiments, multiple solid state emitter chips may be disposed in a symmetrical two-dimensional array, and at least one light affecting element formed by 3D printing may be arranged on, over, or around the multiple solid state emitter chips. In certain embodiments, multiple solid state emitter chips may be disposed in an asymmetrical two-dimensional array, and at least one light affecting element formed by 3D printing may be arranged on, over, or around the multiple solid state emitter chips. In certain embodiments, multiple solid state emitter chips may be disposed on or over a substrate with at least some chips irregularly spaced relative to one another, and at least one light affecting element formed by 3D printing may be arranged on, over, or around the multiple solid state emitter chips.

Figure 14A:
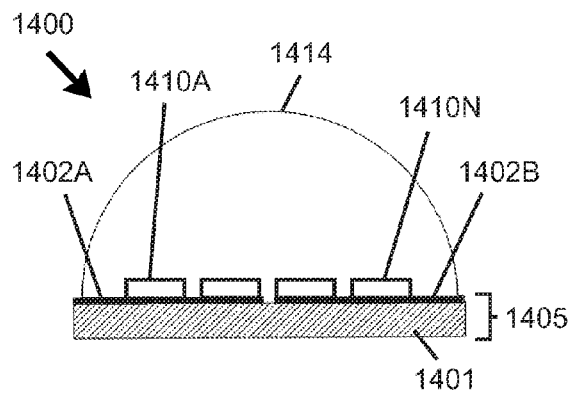
FIG. 14A is a front elevation view of a solid state lighting device including multiple solid state emitter chips disposed in a symmetrical two-dimensional array and arranged under or within a light-affecting element including a substantially symmetric dome-type lens, wherein the light-affecting element is subject to being fabricated by three-dimensional printing.
Figure 14B:
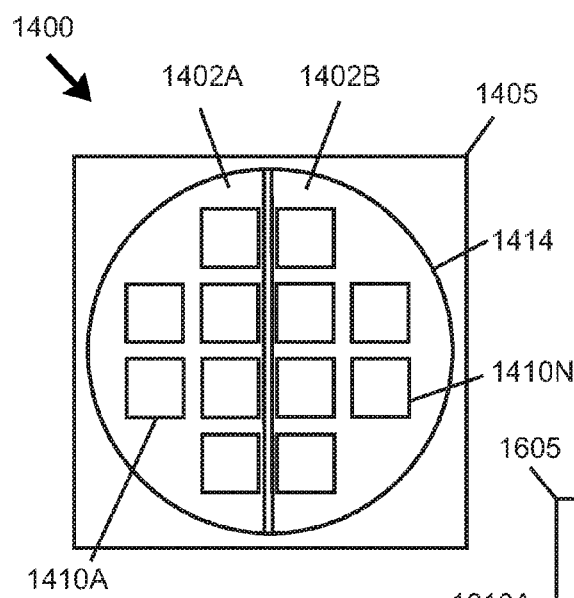
FIG. 14B is a top plan view of the solid state lighting device of FIG. 14A.

FIGS. 14A-14B illustrate a solid state lighting device 1400 including multiple solid state emitter chips 1410A-1410N disposed over a substrate 1405 (including a base material or carrier 1401 and upper surface contact regions 1402A-1402 formed thereon) in a symmetrical two-dimensional array, and at least one light affecting element 1414 formed by 3D printing arranged on, over, or around the multiple solid state emitter chips 1410A-1410N. As shown in FIG. 14A, the light affecting element 1414 may comprise a substantially hemispherical shape.

Figure 15:
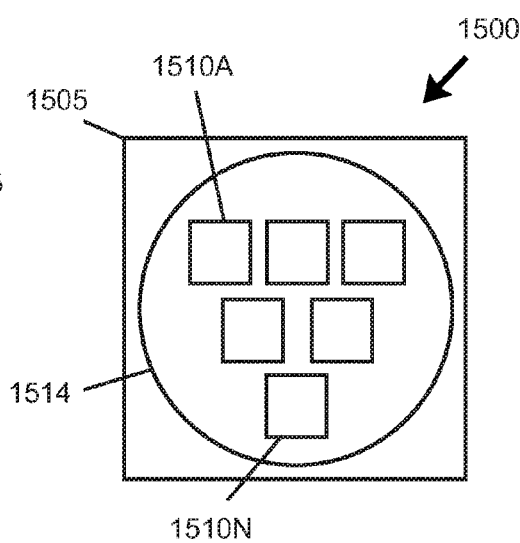
FIG. 15 is a top plan view of a solid state lighting device including multiple solid state emitter chips disposed in an asymmetrical two-dimensional array and arranged under or within a single light-affecting element that is subject to being fabricated by three-dimensional printing.

FIG. 15 illustrates a solid state lighting device 1500 including multiple solid state emitter chips 1510A-1510N disposed over a substrate 1505 in an asymmetrical two-dimensional array, and at least one light affecting element 1514 formable by 3D printing arranged on, over, or around the multiple solid state emitter chips 1510A-1510N. Although emitter chips 1510A-1510N exhibit lateral symmetry relative to a north-south line bisecting the illustrated device 1510, no such symmetry is present with respect to 90 degree rotation of the device, or with respect to an east-west line bisecting the device 1500 as shown.

Figure 16:
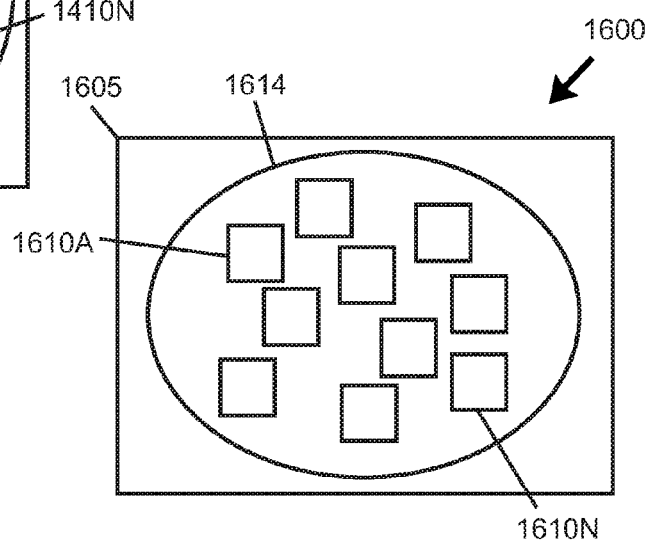
FIG. 16 is a top plan view of a solid state lighting device including multiple solid state emitter chips disposed on a substrate with irregular spacing and arranged under or within a single light-affecting element that is subject to being fabricated by three-dimensional printing.

FIG. 16 illustrates a solid state lighting device 1600 including multiple solid state emitter chips 1610A-1610N disposed on or over a substrate 1605 with at least some solid state emitter chips 1610A-1610N irregularly spaced relative to one another, and at least one light affecting element 1614 formable by 3D printing arranged on, over, or around the multiple solid state emitter chips 1610A-1610N. As illustrated, the light affecting element 1614 exhibits an oval shape in top plan view. A light affecting element embodying any suitable shape for the desired end use may be provided.

Embodiments as disclosed herein may provide one or more of the following beneficial technical effects: providing increased luminous efficacy of lumiphor-converted solid state lighting devices; providing increased energy efficiency of lumiphor-converted solid state lighting devices; enhancing configuration flexibility of solid state lighting devices; and reduced cost of fabrication.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Various combinations and sub-combinations of the structures described herein are contemplated and will be apparent to a skilled person having knowledge of this disclosure. Any of the various features and elements as disclosed herein may be combined with one or more other disclosed features and elements unless indicated to the contrary herein. Correspondingly, the invention as hereinafter claimed is intended to be broadly construed and interpreted, as including all such variations, modifications and alternative embodiments, within its scope and including equivalents of the claims.

What is claimed is:

1. A method for fabricating a lighting device including at least one solid state light emitter arranged on or over a substrate, the method comprising depositing at least one light-affecting element on, over, or around the at least one solid state light emitter using a three-dimensional printing process, and the method further comprises at least one the following features (a) to (f):
    (a) the at least one light-affecting element comprises at least one lumiphoric material;
    (b) wherein the at least one light-affecting element is deposited directly on the at least one solid state light emitter;
    (c) the at least one light-affecting element is deposited directly on the substrate;
    (d) the at least one light-affecting element comprises a cup or dam, and the method further comprises dispensing a liquid material, by a process other than three-dimensional printing, into a recess bounded by the cup or dam;
    (e) the at least one solid state light emitter comprises a first and a second solid state light emitter, and the at least one light-affecting element comprises a first light-affecting element deposited on, over, or around the first solid state light emitter and a second light-affecting element deposited on, over, or around the second solid state light emitter; and the method further comprises: obtaining or receiving information indicative of output characteristics of at least one of the first solid state light emitter and the second solid state light emitter; and adjusting at least one of material composition, material concentration, material curing, thickness, and shape of at least one of the first light-affecting element and the second light-affecting element based on said information indicative of output characteristics of at least one of the first solid state light emitter and the second solid state light emitter; wherein the at least one of material composition, material concentration, material curing, thickness, and shape differs among the first light-affecting element and the second light-affecting element; and
    (f) the at least one solid state light emitter comprises a first and a second solid state light emitter, the at least one light-affecting element comprises a first light-affecting element deposited on, over, or around the first solid state light emitter to yield a first optical distribution based on interaction between the first solid state light emitter and the first light-affecting element; the at least one light-affecting element comprises a second light-affecting element deposited on, over, or around the second solid state light emitter to yield a second optical distribution based on interaction between the second solid state light emitter and the second light-affecting element; and the first optical distribution differs from the second optical distribution.

2. A method according to claim 1, wherein the at least one light-affecting element is arranged to receive at least a portion of emissions generated by the at least one solid state light emitter.

3. A method according to claim 1, wherein the at least one light-affecting element includes a plurality of fused elements comprising a plurality of dots, rods, or layers, wherein a plurality of microscopic boundaries are provided between adjacent dots, rods, or layers of the plurality of dots, rods, or layers.

4. A method according to claim 1, wherein the at least one light-affecting element is deposited directly on the at least one solid state light emitter.

5. A method according to claim 1, wherein the at least one light-affecting element is deposited directly on the substrate.

6. A method according to claim 1, wherein the at least one light-affecting element comprises a light-absorptive material arranged to prevent transmission of light through the at least one light-affecting element.

7. A method according to claim 1, wherein the at least one light-affecting element comprises at least one lumiphoric material.

8. A method according to claim 1, wherein the at least one light-affecting element comprises a cup or dam, and the method further comprises dispensing a liquid material, by a process other than three-dimensional printing, into a recess bounded by the cup or dam.

9. A method according to claim 1, wherein the at least one light-affecting element comprises a plurality of compositionally different materials deposited in discrete areas of the at least one light-affecting element.

10. A method according to claim 1, wherein the substrate comprises a base material or carrier, and the method further comprises depositing a plurality of electrically conductive regions on the base material or carrier by three-dimensional printing.

11. A method according to claim 10, wherein a proximal surface of the at least one solid state light emitter is arranged adjacent to the substrate, wherein a distal surface of the at least one solid state light emitter is arranged distal from the substrate, and the method further comprises forming at least one electrically conductive path between at least one conductive region of the plurality of conductive regions and at least one electrical contact arranged along the distal surface, wherein the at least one electrically conductive path is formed by three-dimensional printing.

12. A method according to claim 1, wherein the at least one solid state light emitter comprises a first and a second solid state light emitter, and the at least one light-affecting element comprises a first light-affecting element deposited on, over, or around the first solid state light emitter and a second light-affecting element deposited on, over, or around the second solid state light emitter; and the method further comprises:
obtaining or receiving information indicative of output characteristics of at least one of the first solid state light emitter and the second solid state light emitter; and
adjusting at least one of material composition, material concentration, material curing, thickness, and shape of at least one of the first light-affecting element and the second light-affecting element based on said information indicative of output characteristics of at least one of the first solid state light emitter and the second solid state light emitter;
wherein at least one of material composition, material concentration, material curing, thickness, and shape differs among the first light-affecting element and the second light-affecting element.

13. A method according to claim 1, wherein:
the at least one solid state light emitter comprises a first and a second solid state light emitter;
the at least one light-affecting element comprises a first light-affecting element deposited on, over, or around the first solid state light emitter arranged to yield a first optical distribution based on interaction between the first solid state light emitter and the first light-affecting element;
the at least one light-affecting element comprises depositing a second light-affecting element deposited on, over, or around the second solid state light emitter arranged to yield a second optical distribution based on interaction between the second solid state light emitter and the second light-affecting element; and
the first optical distribution differs from the second optical distribution.

14. A lighting device comprising:
a substrate;
at least one solid state light emitter arranged on or over the substrate; and
at least one light-affecting element arranged to receive at least a portion of emissions generated by the at least one solid state light emitter;
wherein the at least one light-affecting element includes a plurality of fused elements comprising a plurality of dots, rods, or layers, and the the lighting device comprises at least one of the following features (i) to (iv):
(i) the at least one light-affecting element comprises a light-transmissive material deposited directly on at least one of the substrate and the at least one solid state light emitter and arranged to transmit at least a portion of a spectral output of the at least one solid state light emitter;
(ii) the at least one light-affecting element comprises a light-reflective material deposited on or over the substrate and arranged to reflect at least a portion of a spectral output of the at least one solid state light emitter; and
(iii) the at least one light-affecting element comprises a lumiphoric material arranged to absorb at least a portion of a spectral output of the at least one solid state emitter and responsively re-emit at least one spectral output comprising a different peak wavelength than a peak wavelength of the at least one solid state light emitter;
(iv) the at least one solid state light emitter comprises a plurality of solid state light emitters; the at least one light-affecting element comprises a first light-affecting element arranged on, over, or around a first solid state light emitter of the plurality of solid state light emitters to yield a first optical distribution based on interaction between the first solid state light emitter and the first light-affecting element; the at least one light-affecting element comprises a second light-affecting element arranged on, over, or around a second solid state light emitter of the plurality of solid state light emitters to yield a second optical distribution based on interaction between the second solid state light emitter and the second light-affecting element; and the first optical distribution differs from the second optical distribution.

15. A lighting device according to claim 14, wherein the at least one light-affecting element comprises a plurality of microscopic boundaries between adjacent dots, rods, or layers of the plurality of dots, rods, or layers.

16. A lighting device according to claim 14, wherein each dot, rod, or layer of the plurality of dots, rods, or layers comprises an outer dimension of less than about 100 μm.

17. A lighting device according to claim 14, wherein the plurality of fused elements is formed by three-dimensional printing.

18. A lighting device according to claim 14, wherein the at least one light-affecting element is deposited directly on the substrate.

19. A lighting device according to claim 14, wherein the at least one light-affecting element comprises a light-transmissive material deposited directly on at least one of the substrate and the at least one solid state light emitter, and arranged to transmit at least a portion of a spectral output of the at least one solid state light emitter.

20. A lighting device according to claim 14, wherein the at least one light-affecting element comprises a light-reflective material deposited on or over the substrate and arranged to reflect at least a portion of a spectral output of the at least one solid state light emitter.

21. A lighting device according to claim 14, wherein the at least one light-affecting element comprises a light-absorptive material deposited on at least one of the substrate and the at least one solid state light emitter and arranged to absorb at least a portion of a spectral output of the at least one solid state light emitter.

22. A lighting device according to claim 14, wherein the at least one light-affecting element comprises a lumiphoric material arranged to absorb at least a portion of a spectral output of the at least one solid state light emitter and responsively re-emit at least one spectral output comprising a different peak wavelength than a peak wavelength of the at least one solid state light emitter.

23. A lighting device according to claim 14, wherein the substrate comprises a base material and a plurality of electrically conductive regions deposited on the base material by three-dimensional printing.

24. A lighting device according to claim 14, wherein the at least one light-affecting element is arranged to affect at least one of beam width, beam direction, beam focus, and beam symmetry of light output by the lighting device.

25. A lighting device according to claim 14, wherein:
the at least one solid state light emitter comprises a plurality of solid state light emitters;
the at least one light-affecting element comprises a first light-affecting element arranged on, over, or around a first solid state light emitter of the plurality of solid state light emitters to yield a first optical distribution based on interaction between the first solid state light emitter and the first light-affecting element;
the at least one light-affecting element comprises a second light-affecting element arranged on, over, or around a second solid state light emitter of the plurality of solid state light emitters to yield a second optical distribution based on interaction between the second solid state light emitter and the second light-affecting element; and the first optical distribution differs from the second optical distribution.

26. A lighting device according to claim 25, wherein:

the first light-affecting element is arranged on the first solid state light emitter and the second light-affecting element is arranged on the second solid state light emitter; and the first light-affecting element differs from the second light-affecting element with respect to at least one of the following parameters: material composition, material concentration, material curing, thickness, and shape.

\* \* \* \* \*